(12) United States Patent
Kemmochi et al.

(10) Patent No.: US 7,253,702 B2
(45) Date of Patent: Aug. 7, 2007

(54) HIGH-FREQUENCY SWITCH MODULE

(75) Inventors: Shigeru Kemmochi, Saitama-ken (JP); Mitsuhiro Watanabe, Saitama-ken (JP); Hiroyuki Tai, Tottori-ken (JP); Keisuke Fukamachi, Saitama-ken (JP); Satoru Yokouchi, Saitama-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 268 days.

(21) Appl. No.: 10/415,595

(22) PCT Filed: Nov. 1, 2001

(86) PCT No.: PCT/JP01/09587

§ 371 (c)(1),
(2), (4) Date: Sep. 16, 2003

(87) PCT Pub. No.: WO02/37709

PCT Pub. Date: May 10, 2002

(65) Prior Publication Data

US 2004/0032706 A1    Feb. 19, 2004

(30) Foreign Application Priority Data

Nov. 1, 2000 (JP) .............................. 2000-334622
Jul. 27, 2001 (JP) .............................. 2001-227723

(51) Int. Cl.
*H03H 9/72* (2006.01)
(52) U.S. Cl. ..................... 333/133; 455/78; 455/83
(58) Field of Classification Search ................ 333/133, 333/193
See application file for complete search history.

(56) References Cited

U.S. PATENT DOCUMENTS

| 3,573,673 A | * | 4/1971 | De Vries et al. ............. 333/194 |
| 3,582,837 A | * | 6/1971 | DeVries ...................... 333/193 |
| 5,521,561 A | * | 5/1996 | Yrjola et al. ................ 333/103 |
| 5,699,027 A | * | 12/1997 | Tsuji et al. .................. 333/193 |
| 5,903,820 A | * | 5/1999 | Hagstrom ..................... 455/82 |
| 5,994,980 A | * | 11/1999 | Tada .......................... 333/193 |
| 6,060,960 A | * | 5/2000 | Tanaka et al. ............... 333/104 |
| 6,417,574 B1 | * | 7/2002 | Misawa et al. ............. 257/778 |
| 6,445,262 B1 | * | 9/2002 | Tanaka et al. ............... 333/133 |
| 6,456,172 B1 | * | 9/2002 | Ishizaki et al. ............. 333/133 |

(Continued)

FOREIGN PATENT DOCUMENTS

EP    0 667 684 A1    8/1995

(Continued)

OTHER PUBLICATIONS

Nakai, S., "Parts Corresponding to Mobile Phone—PHS", Nikkan Kogyo Shinbun (Daily News of Business & Technology), pp. 28, (Sep. 23, 1998).

(Continued)

*Primary Examiner*—Barbara Summons
(74) *Attorney, Agent, or Firm*—Finnegan, Henderson, Farabow, Garrett & Dunner, LLP

(57) ABSTRACT

A high-frequency switch module, including a laminate constituted of dielectric layers having electrode patterns, the high-frequency switch module also including a high-frequency switch circuit for switching a transmitting circuit and a receiving circuit of transmitting/receiving systems, and a filter circuit connected to a receiving side of the high-frequency switch circuit.

16 Claims, 36 Drawing Sheets

U.S. PATENT DOCUMENTS

| | | | |
|---|---|---|---|
| 6,483,402 B2 * | 11/2002 | Endoh et al. | 333/193 |
| 6,556,100 B2 * | 4/2003 | Takamine | 333/133 |
| 6,628,178 B2 * | 9/2003 | Uchikoba | 333/193 |
| 6,788,958 B2 * | 9/2004 | Furutani et al. | 455/552.1 |
| 7,003,312 B2 * | 2/2006 | Kemmochi et al. | 455/552.1 |
| 7,035,602 B2 * | 4/2006 | Satoh et al. | 455/118 |

FOREIGN PATENT DOCUMENTS

| | | |
|---|---|---|
| EP | 0 736 978 A2 | 10/1996 |
| EP | 0 820 155 A2 | 1/1998 |
| EP | 0 910 132 A2 | 4/1999 |
| EP | 1 014 592 A2 * | 6/2000 |
| JP | 2-108301 | 4/1990 |
| JP | 6-197040 | 7/1994 |
| JP | 08-237166 | 9/1996 |
| JP | 10-32521 | 2/1998 |
| JP | 11-154804 | 6/1999 |
| JP | 11-225089 | 8/1999 |
| JP | 2001-211097 | 8/2001 |
| WO | WO 00/19627 | 4/2000 |
| WO | WO 01/45285 * | 6/2001 |

OTHER PUBLICATIONS

International Search Report mailed on Feb. 5, 2002 in corresponding PCT Application No. PCT/JP01/09587.

* cited by examiner

M1 : 1.880GHz
M2 : 1.710GHz

M1 : 1.880GHz
M2 : 1.710GHz

M1 : 1.880GHz
M2 : 1.710GHz

M1 : 1.880GHz
M2 : 1.710GHz

M1 : 1.880GHz
M2 : 1.710GHz

M1 : 1.880GHz
M2 : 1.710GHz

M1 : 1.880GHz
M2 : 1.710GHz

HIGH-FREQUENCY SWITCH MODULE

FIELD OF THE INVENTION

The present invention relates to a high-frequency switch module used in a high-frequency band such as a microwave band, etc., particularly to a high-frequency switch module comprising high-frequency switches and other high-frequency parts such as filters, etc. as a composite structure.

BACKGROUND OF THE INVENTION

Recently remarkable development has been made in mobile communications devices such as mobile phones, etc. There are high-frequency switches for switching the connection of an antenna to a transmitting circuit, and the connection of the antenna to a receiving circuit, as high-frequency parts used in mobile communications devices.

For instance, the high-frequency switch disclosed in JP 2-108301 A handles one transmitting/receiving system for EGSM900 (extended global system for mobile communications), GSM1800, PCS (personal communications service), etc., which comprises switching elements (diodes) arranged between the transmitting circuit and the antenna, and λ/4 phase lines arranged between the antenna and the receiving circuit. Because the receiving circuit side of the λ/4 line is grounded via a diode, the high-frequency switch is operated by bias current flowing through each diode as a λ/4 switch circuit for switching signal lines.

FIG. 38 is a block diagram showing one example of RF circuits for single-band mobile phones having such high-frequency switches. A mobile communications device such as a mobile phone, etc., comprising a high-frequency switch comprises a high-frequency switch circuit SW connected to an antenna ANT; a filter circuit such as a low-pass filter f1, etc. arranged between a transmitting circuit TX and the high-frequency switch circuit SW for preventing harmonic contained in a transmission signal from the transmitting circuit TX from emitting from the antenna ANT, and preventing part of a receiving signal from the antenna ANT from entering into the transmitting circuit TX; and a filter circuit such as a band pass filter f2, etc., particularly a surface acoustic wave filter (SAW filter), arranged between the antenna ANT and a receiving circuit RX for preventing part of a transmission signal from the transmission circuit TX from entering into the receiving circuit RX, and removing noise from the receiving signal from the antenna ANT.

Developed in addition to such single-band mobile phones in accordance with drastic spreading of mobile phones are multi-band mobile phones such as dual-band mobile phones, triple-band mobile phones, etc., which comprise one mobile terminal capable of handling a plurality of communications systems. While the single-band mobile phones handle only one transmitting/receiving system, the dual-band mobile phones handle two transmitting/receiving systems, and the triple-band mobile phones handle three transmitting/receiving systems. One example of RF circuit blocks for the multi-band mobile phones is shown in FIG. 36. This example is an RF circuit block of a dual-band mobile phone comprising a diplexer DP constituted by a plurality of filters, high-frequency switch circuits SW1, SW2 for switching the connection of an antenna ANT to a transmitting circuit TX and a receiving circuit RX, so that dual-direction communications can be carried out with one antenna for both transmitting and receiving.

A mobile phone of EGSM900, etc. comprises a balanced-type high-frequency part (for instance, a low-noise amplifier LNA arranged in a receiving line RX, a mixer MIX arranged downstream thereof, etc.) having two signal lines in an RF circuit, to decrease a noise figure while increasing receiving sensitivity.

When the low-noise amplifier LNA is a balanced input type, as shown in FIG. 37, a SAW filter connected to the low-noise amplifier LNA is conventionally an unbalanced type having one signal terminal, namely has the structure of an unbalanced-unbalanced-type filter, needing a balanced-to-unbalanced transforming circuit in connection to LNA.

Though devices such as high-frequency switches, SAW filters, etc. are usually designed to have a characteristic impedance of 50 Ω, the low-noise amplifier LNA has an input impedance of about 50Ω-300Ω. Accordingly, the high-frequency parts often have different characteristic impedances, needing impedance-converting circuits. Known as a circuit element having both functions of a balanced-to-unbalanced transforming circuit and an impedance-converting circuit is a balanced-to-unbalanced transformer (balun), the use of the balun inevitably increases the number of parts. In addition, impedance matching should be taken into consideration in the connection of the balanced-to-unbalanced transformer to the SAW filter, needing accessory parts for impedance matching such as capacitors, inductors, etc. This causes the problem of increasing the size of mobile phones, resulting in cost increase.

To make high-frequency parts smaller and lighter in weight, part of elements such as capacitors, inductors, etc. for constituting high-frequency switch circuits, filter circuits, etc. are contained in a laminate (multi-layer substrate) by an LTCC (low temperature co-fireable ceramics) technology, thereby providing composite parts having a plurality of circuit functions.

For instance, JP 6-197040 A discloses a high-frequency switch comprising transmission lines and capacitors integrally contained in a laminate constituted by low-temperature-sinterable dielectric ceramic sheets. Also, JP 10-32521 A discloses a small, light-weight, high-frequency switch comprising RF interstage filters (SAW filter) integrally mounted on a multi-layer substrate. Further, JP 11-225089 A discloses a high-frequency switch for multi-band mobile phones comprising a diplexer and high-frequency switches integrally contained in a laminate made of a low-temperature-sinterable dielectric ceramic material to handle two or more transmitting/receiving systems. Parts containing such high-frequency switches and other high-frequency parts as a composite structure are called high-frequency switch modules.

Though part of circuit elements such as capacitors, inductors, etc. can be contained in the laminate by the LTCC technology to have a plurality of circuit functions in a composite structure in the high-frequency switch module, it has not been easy to obtain electric characteristics on a level acceptable for practical use. For instance, when high-frequency switches are integrated with SAW filters connected to their receiving system in the laminate, impedance matching between the high-frequency switches and the SAW filters should be taken into sufficient consideration, and they should be connected such that there is small reflection loss at their connection points. If otherwise, it would be impossible to reduce the loss of a receiving signal due to mismatch in receiving lines from the high-frequency switches to the output terminals of the SAW filters. However, the composite structure of the high-frequency switches and the SAW filters increases the loss of a transmitting signal in a transmission line from the transmitting circuit to the antenna, failing to obtaining desired electric characteristics. In addition, an attempt to balance part of high-frequency circuits constituting the high-frequency switch module has never been made so far.

OBJECTS OF THE INVENTION

Accordingly, an object of the present invention is to provide a small, high-frequency switch module comprising high-frequency switches and other high-frequency parts such as SAW filters as an integral composite structure, which has excellent electric characteristics.

Another object of the present invention is to provide a high-frequency switch module comprising a balanced-to-unbalanced transforming circuit or a balanced-to-unbalanced transforming circuit and an impedance-converting circuit, which has excellent electric characteristics.

DISCLOSURE OF THE INVENTION

The high-frequency switch module according to the first embodiment of the present invention comprises a high-frequency switch circuit comprising a plurality of switching elements, which is connected between an antenna and a transmitting circuit and a receiving circuit; and a surface acoustic wave filter connected between said high-frequency switch circuit and said receiving circuit; said high-frequency switch module comprising as a multi-layer substrate a laminate constituted by a plurality of dielectric layers each having an electrode pattern; wherein a phase shift circuit is arranged between said switch circuit and said surface acoustic wave filter; wherein said high-frequency switch circuit comprises a first switching element, a first transmission line and a first capacitor as main elements; wherein at least part of said first transmission line and said first capacitor is constituted by said electrode patterns in said laminate; and wherein said surface acoustic wave filter is mounted on said laminate.

The high-frequency switch module according to the second embodiment of the present invention comprises a laminate constituted by a plurality of dielectric layers each having an electrode pattern as a multi-layer substrate, said high-frequency switch module comprising a high-frequency switch circuit for switching a transmitting circuit and a receiving circuit of transmitting/receiving systems, a balanced-to-unbalanced transforming circuit for connecting a balanced circuit and an unbalanced circuit, which is connected to a receiving system of said high-frequency switch circuit, wherein said high-frequency switch circuit comprises a first switching element, a first transmission line and a first capacitor as main elements; wherein at least part of said first transmission line and said first capacitor is constituted by said electrode patterns in the laminate; wherein said balanced-to-unbalanced transforming circuit is a surface acoustic wave filter with unbalanced input and balanced output, which is mounted on said laminate.

The high-frequency switch module according to the third embodiment of the present invention comprises a laminate constituted by a plurality of dielectric layers each having an electrode pattern as a multi-layer substrate, said high-frequency switch module comprising a high-frequency switch circuit for switching a transmitting circuit and a receiving circuit of transmitting/receiving systems, a surface acoustic wave filter connected to a receiving system of said high-frequency switch circuit, and a balanced-to-unbalanced transforming circuit connected to said surface acoustic wave filter; wherein said high-frequency switch circuit comprises a switching element, a first transmission line and a first capacitor as main elements; wherein at least part of said first transmission line and said first capacitor is constituted by said electrode patterns in said laminate; wherein said balanced-to-unbalanced transforming circuit is a balanced-to-unbalanced transformer; wherein said balanced-to-unbalanced transformer comprises a second transmission line as a main element; and wherein said second transmission line is formed by said electrode patterns in said laminate.

BEST MODE FOR CARRYING OUT THE INVENTION

Figure 1:
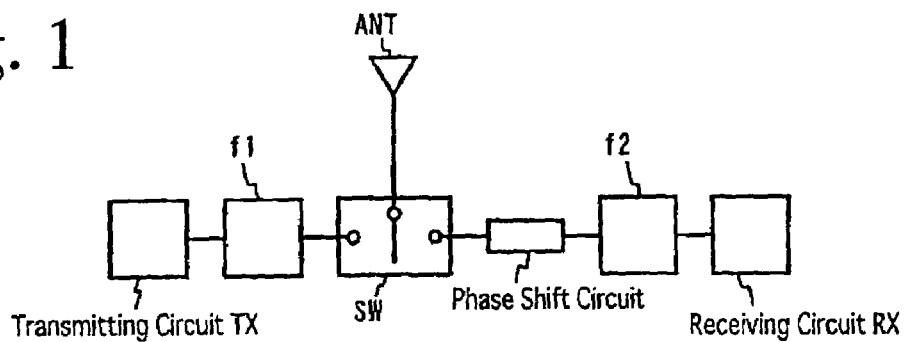
FIG. 1 is a block diagram showing the circuit of the high-frequency switch module according to one embodiment of the present invention.
Figure 2:
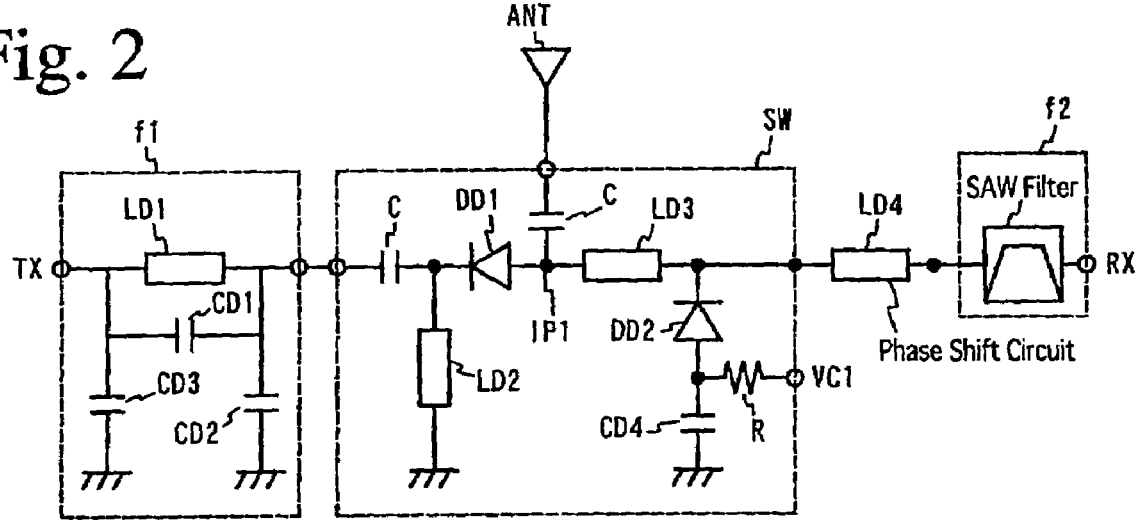
FIG. 2 is a view showing one example of the equivalent circuit of the high-frequency switch module shown in FIG. 1.

FIG. 1 shows one example of the high-frequency switch module of the present invention the circuit, and FIG. 2 shows one example of the equivalent circuit of the high-frequency switch module of FIG. 1. In this high-frequency switch module, a phase shift circuit LD4 is arranged between a high-frequency switch SW and a SAW filter f2, and these parts are combined as a composite structure.

As a result of investigating the combination of the high-frequency switch SW and the SAW filter as a composite structure, it has been found that the loss of a transmitting signal coming from a transmitting circuit would increase, if consideration were made only on impedance matching between the high-frequency switch SW and the SAW filter connected thereto on its receiving circuit side at a connection point. Accordingly, investigation has been conducted on insertion loss characteristics between a transmitting circuit TX and an antenna ANT, in a high-frequency switch module in which the high-frequency switch for GSM1800 and the SAW filter are combined as a composite structure without interposing a phase shift circuit. As a result, as shown in FIG. 8, it has been found that there is attenuation called "dip" at 1.7 GHz near the transmitting frequency of GSM1800, whereby insertion loss in a transmitting frequency band is deteriorated to as large as about 2 times that when no SAW filter is connected.

As a result of investigation about the cause of the dip, it has been found that by combining the high-frequency switches and the SAW filters as a composite structure, part of a transmitting signal is absorbed on the side of a receiving circuit, causing attenuation called "dip," and thus increasing insertion loss in the transmitting signal.

Figure 7:
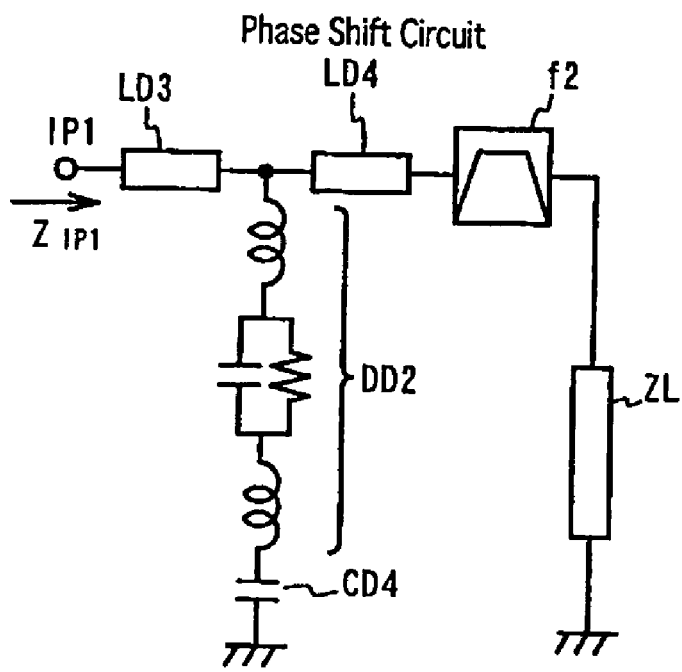
FIG. 7 is a view showing an equivalent circuit when the receiving circuit RX is viewed from the connection point IP1 at the time of transmission.
Figure 8A:
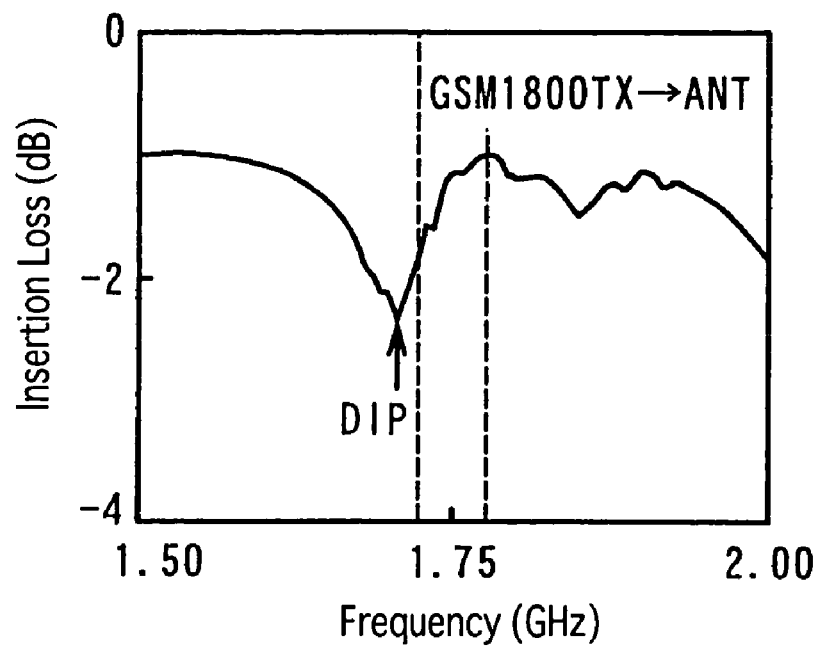
FIG. 8(a) is a graph showing insertion loss characteristics from GSM1800 TX to ANT when the high-frequency switch is directly connected to the SAW filter.
Figure 8B:
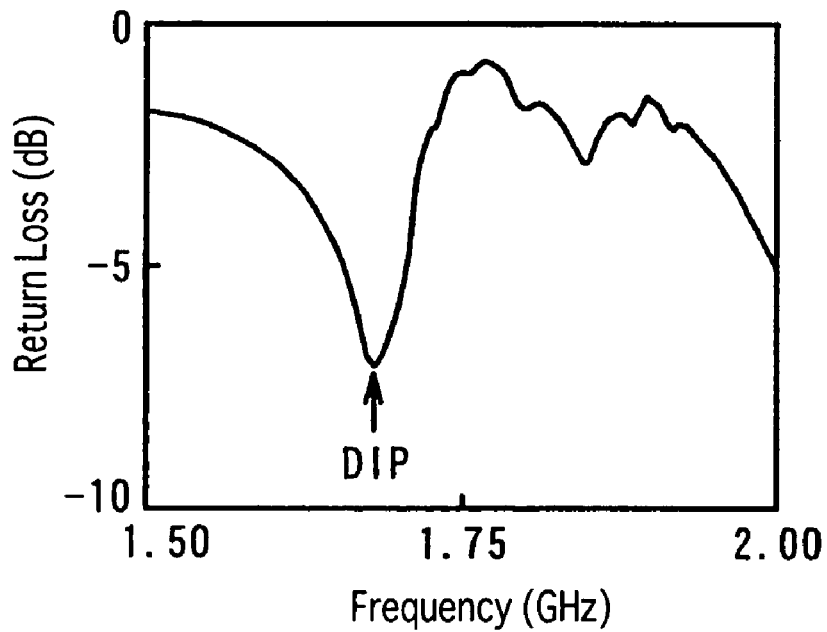
FIG. 8(b) is a graph showing reflection characteristics viewed from the connection point IP1 when the high-frequency switch is directly connected to the SAW filter.
Figure 8C:
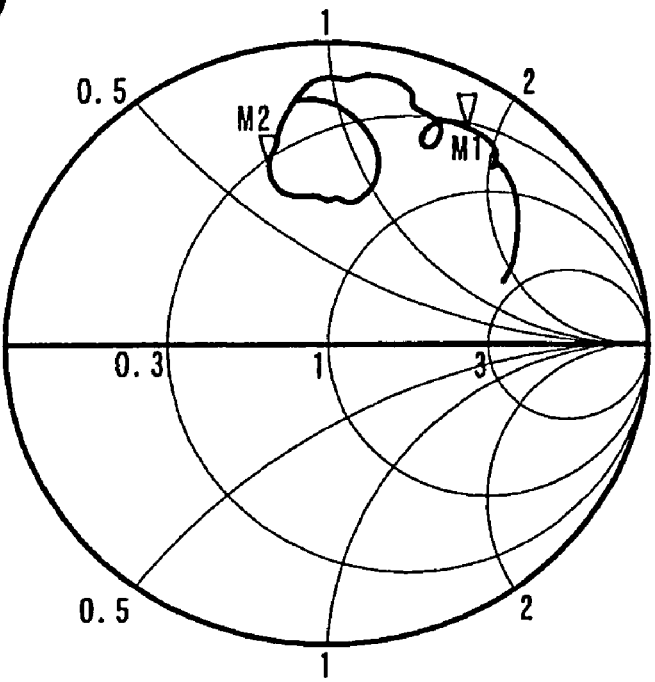
FIG. 8(c) is a Smith chart showing impedance characteristics when the high-frequency switch is directly connected to the SAW filter.
Figure 8D:
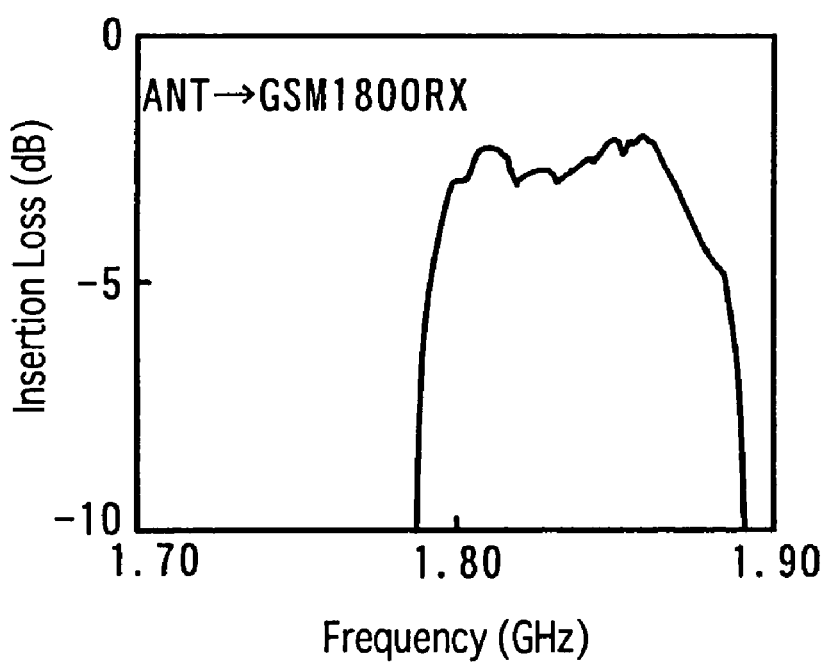
FIG. 8(d) is a graph showing insertion loss characteristics from the antenna ANT to GSM1800 RX when the high-frequency switch is directly connected to the SAW filter.
Figure 9A:
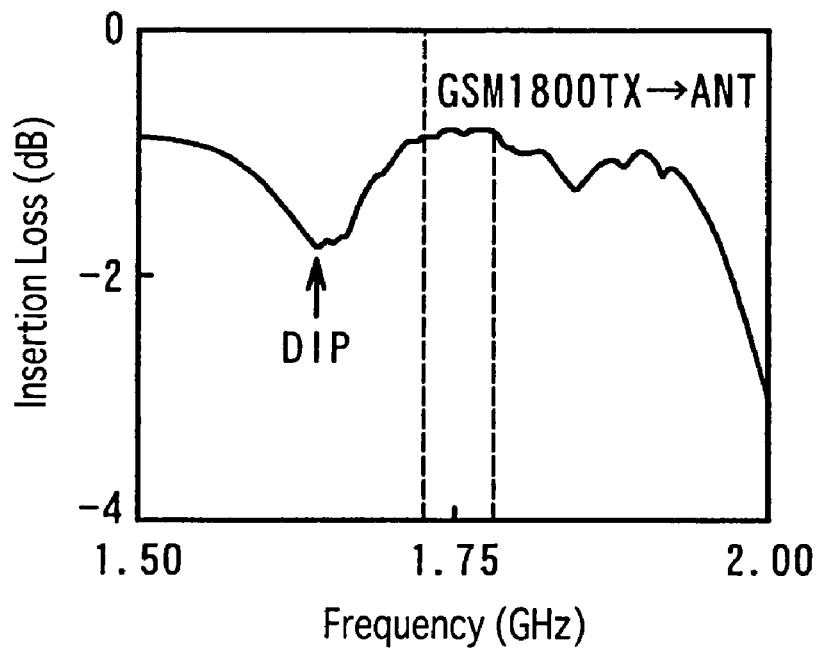
FIG. 9(a) is a graph showing insertion loss characteristics from GSM1800 TX to ANT when the high-frequency switch is connected to the SAW filter via a transmission line.
Figure 9B:
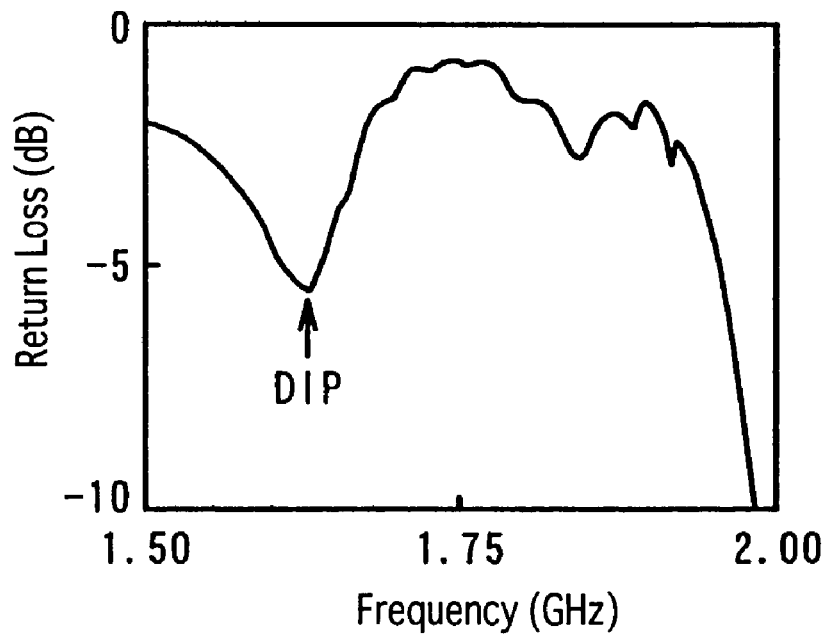
FIG. 9(b) is a graph showing reflection characteristics viewed from the connection point IP1 when the high-frequency switch is connected to the SAW filter via a transmission line.
Figure 9C:
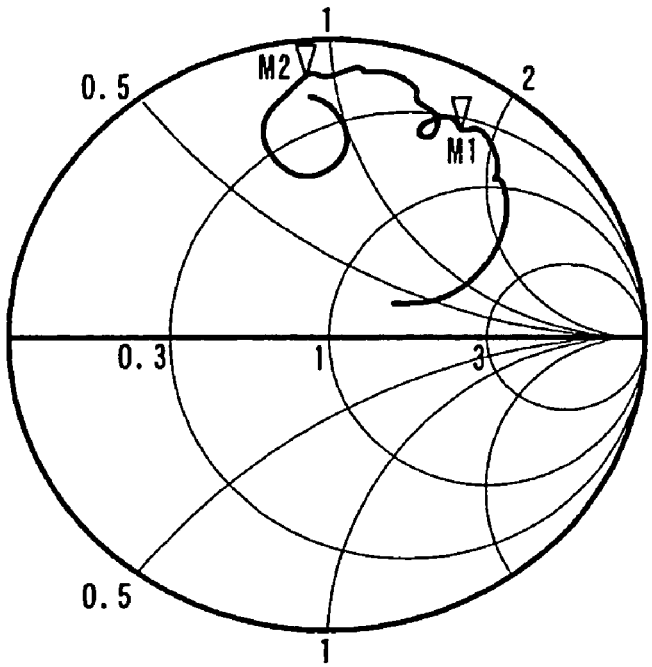
FIG. 9(c) is a Smith chart showing impedance characteristics when the high-frequency switch is connected to the SAW filter via a transmission line.
Figure 9D:
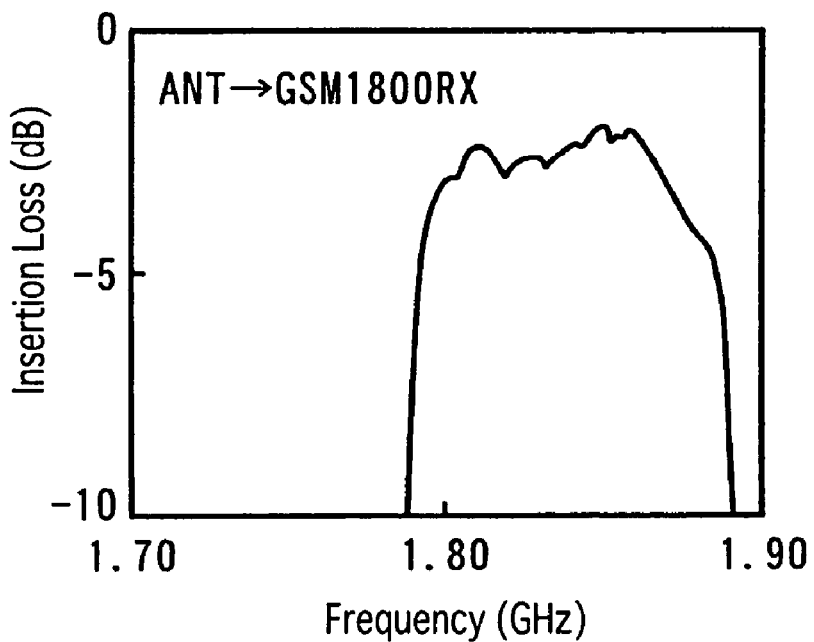
FIG. 9(d) is a graph showing insertion loss characteristics from ANT to GSM1800 RX when the high-frequency switch is connected to the SAW filter via a transmission line.
Figure 10A:
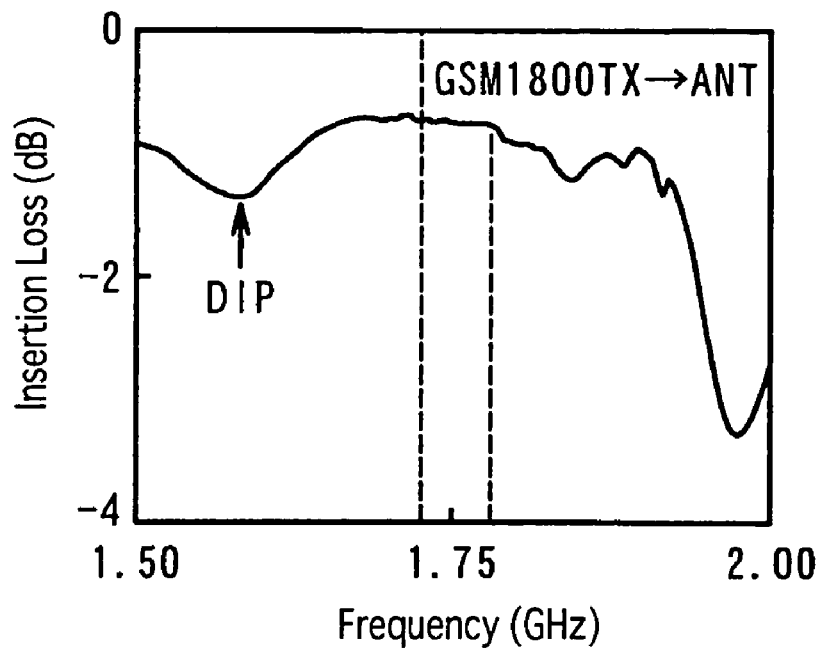
FIG. 10(a) is a graph showing insertion loss characteristics from GSM1800 TX to ANT when the high-frequency switch is connected to the SAW filter via a transmission line.
Figure 10B:
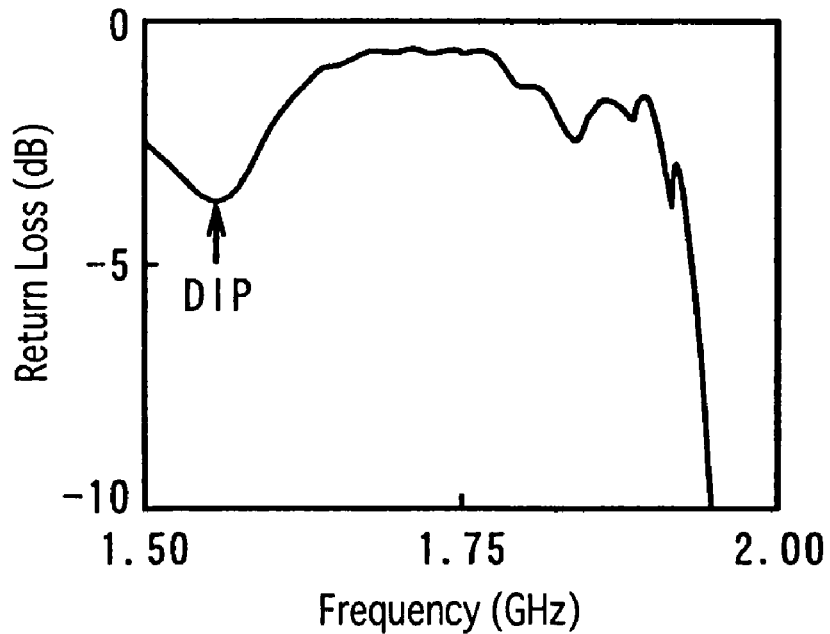
FIG. 10(b) is a graph showing reflection characteristics viewed from the connection point IP1 when the high-frequency switch is connected to the SAW filter via a transmission line.
Figure 10C:
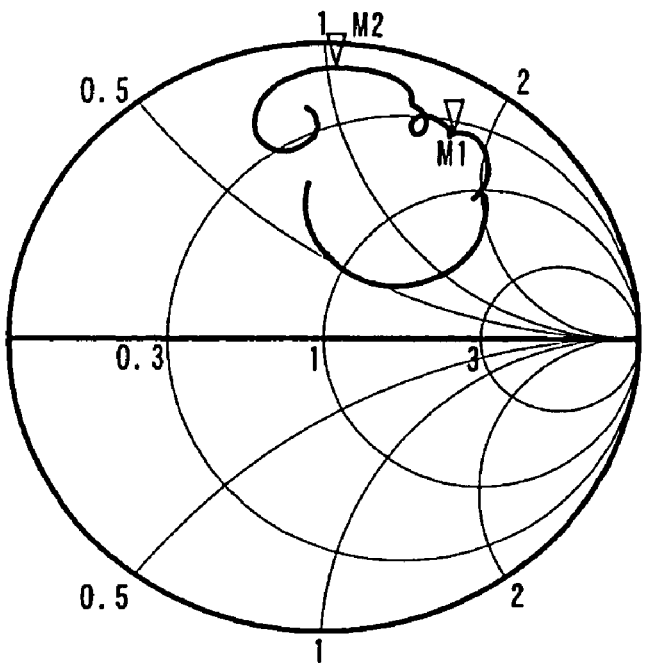
FIG. 10(c) is a Smith chart showing impedance characteristics when the high-frequency switch is connected to the SAW filter via a transmission line.
Figure 10D:
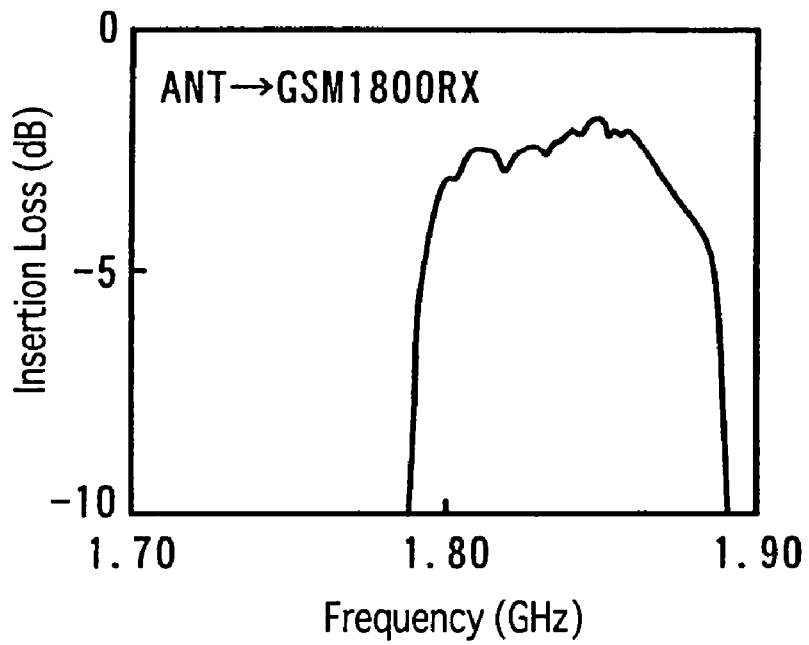
FIG. 10(d) is a graph showing insertion loss characteristics from ANT to GSM1800 RX when the high-frequency switch is connected to the SAW filter via a transmission line.
Figure 11A:
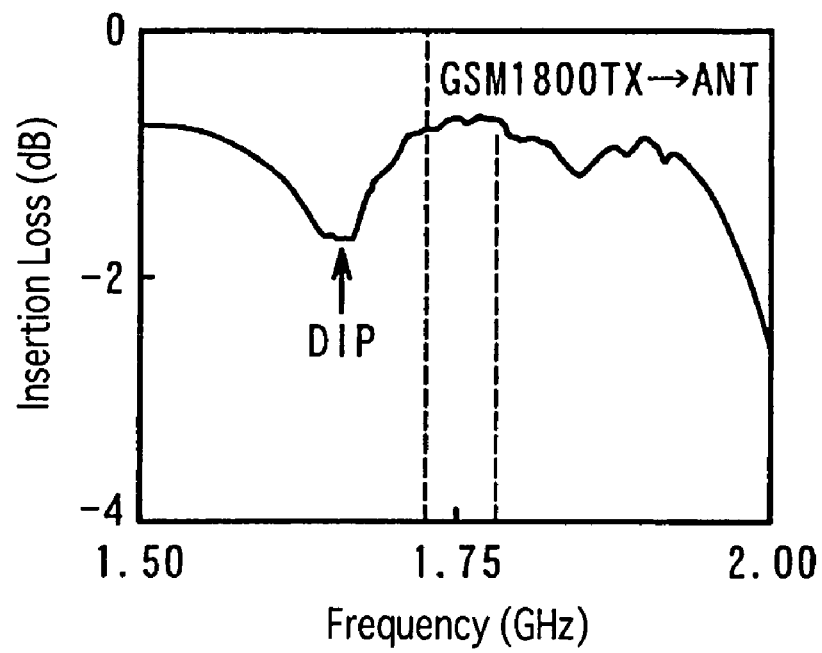
FIG. 11(a) is a graph showing insertion loss characteristics from GSM1800 TX to ANT when the high-frequency switch is connected to the SAW filter via an inductor.
Figure 11B:
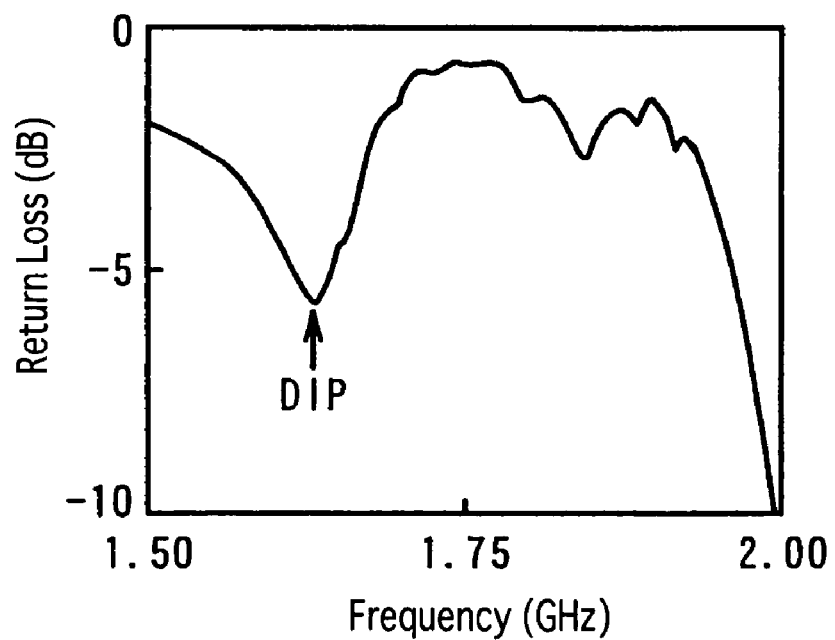
FIG. 11(b) is a graph showing reflection characteristics viewed from the connection point IP1 when the high-frequency switch is connected to the SAW filter via an inductor.
Figure 11C:
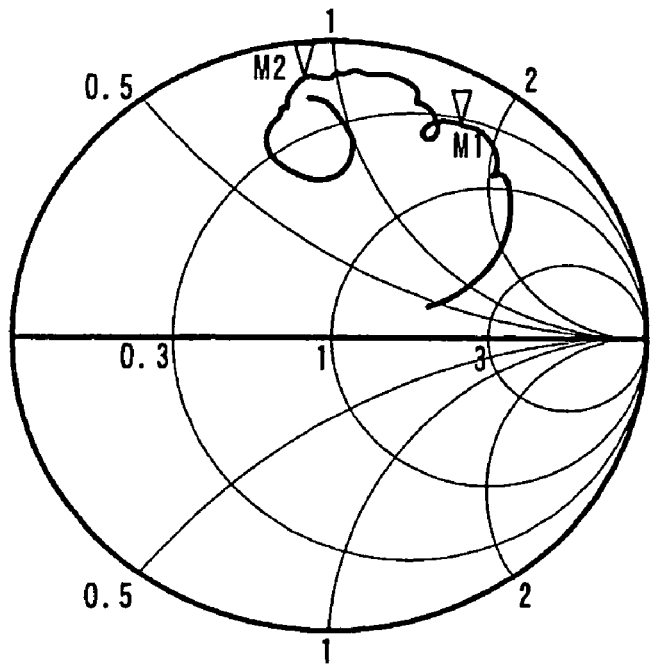
FIG. 11(c) is a Smith chart showing impedance characteristics when the high-frequency switch is connected to the SAW filter via an inductor.
Figure 11D:
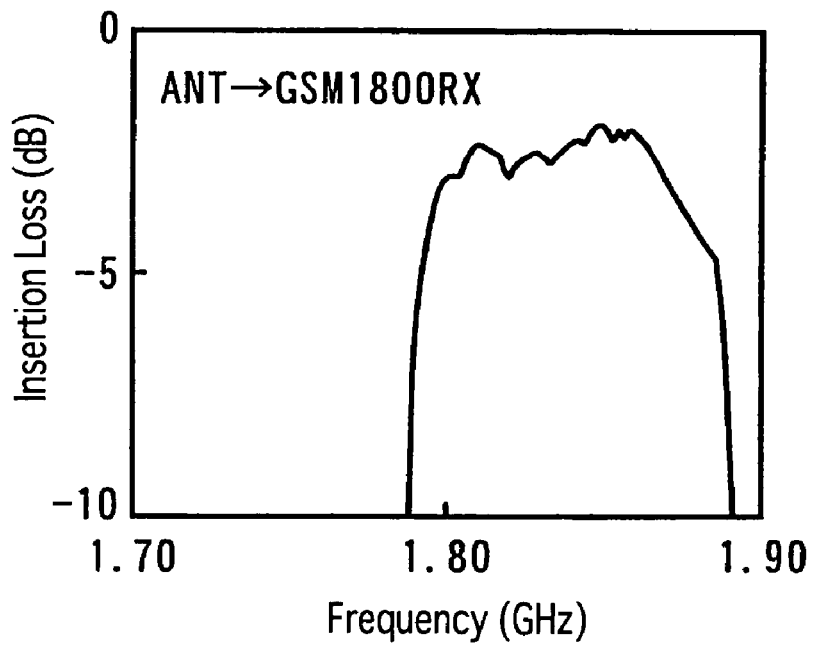
FIG. 11(d) is a graph showing insertion loss characteristics from ANT to GSM1800 RX when the high-frequency switch is connected to the SAW filter via an inductor.
Figure 12A:
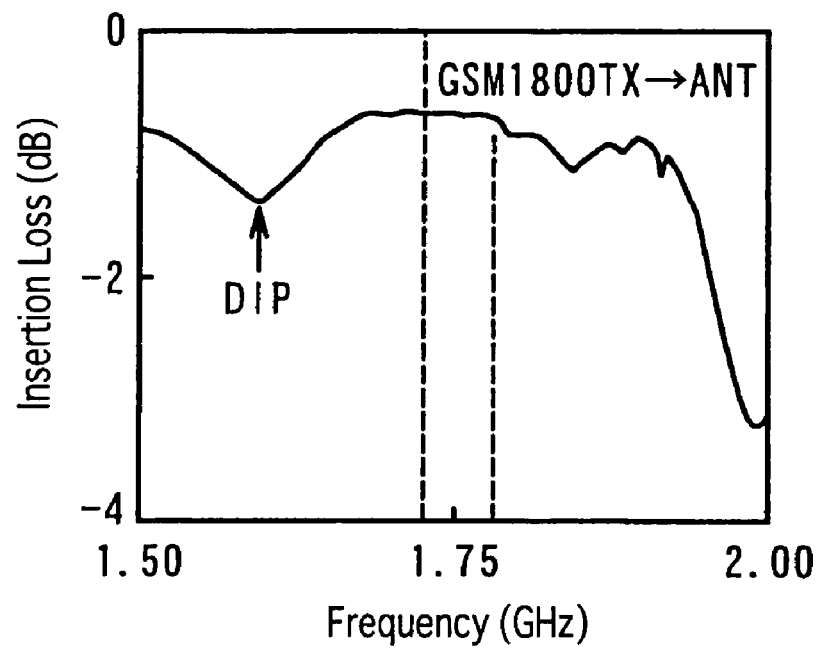
FIG. 12(a) is a graph showing insertion loss characteristics from GSM1800 TX to ANT when the high-frequency switch is connected to the SAW filter via an inductor.
Figure 12B:
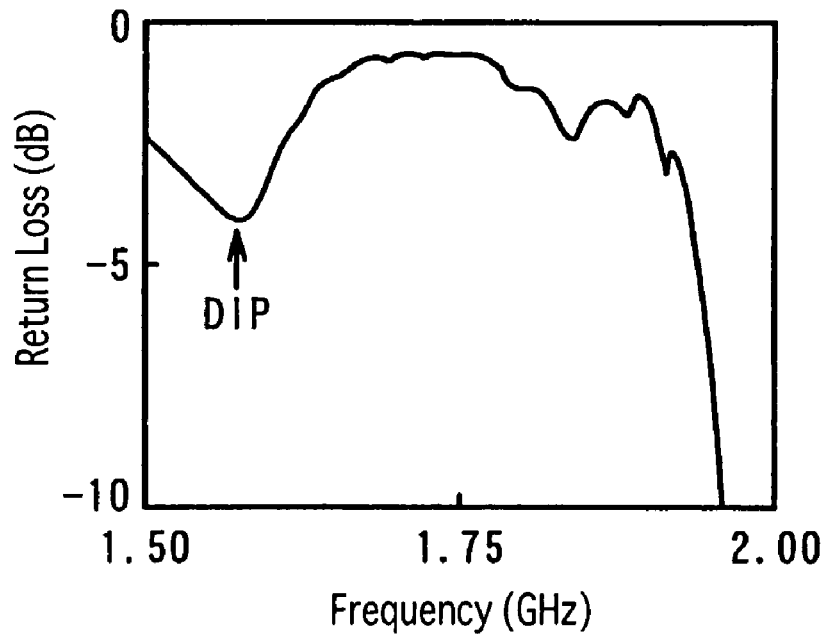
FIG. 12(b) is a graph showing reflection characteristics viewed from the connection point IP1 when the high-frequency switch is connected to the SAW filter via an inductor.
Figure 12C:
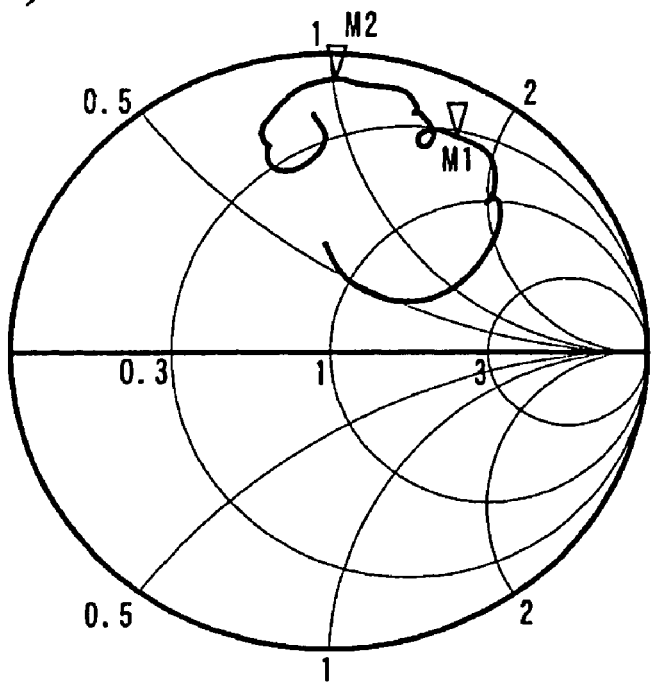
FIG. 12(c) is a Smith chart showing impedance characteristics when the high-frequency switch is connected to the SAW filter via an inductor.
Figure 12D:
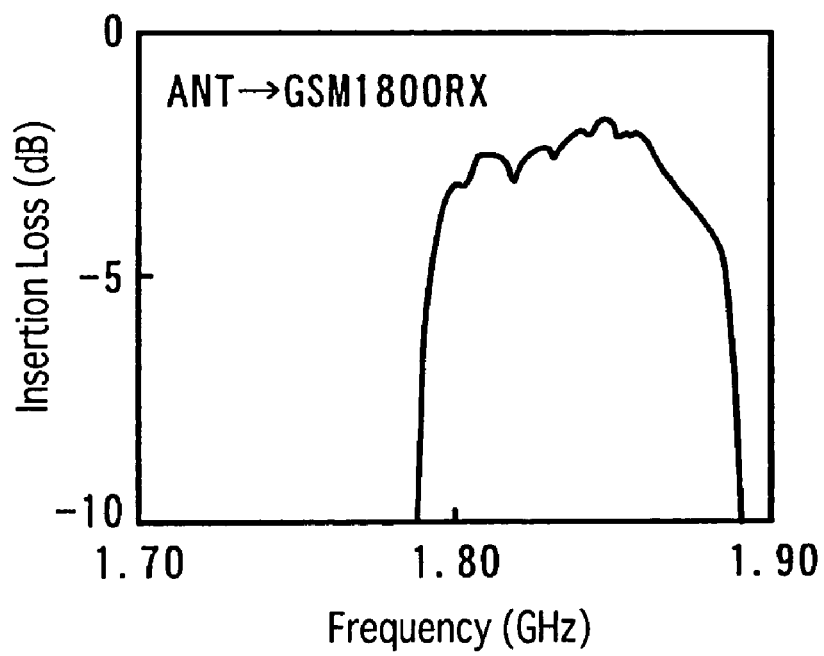
FIG. 12(d) is a graph showing insertion loss characteristics from ANT to GSM1800 RX when the high-frequency switch is connected to the SAW filter via an inductor.
Figure 13A:
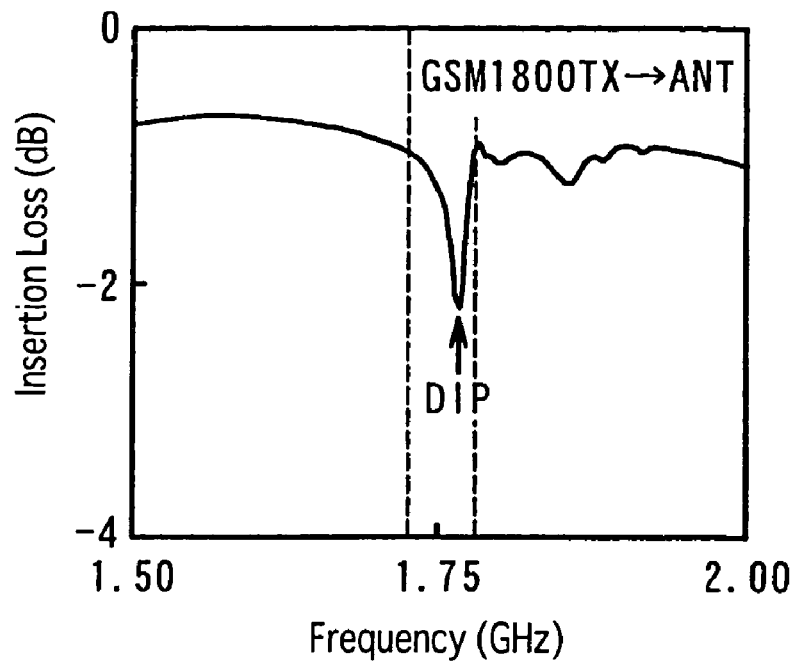
FIG. 13(a) is a graph showing insertion loss characteristics from GSM1800 TX to ANT when the high-frequency switch is connected to the SAW filter via a capacitor.
Figure 13B:
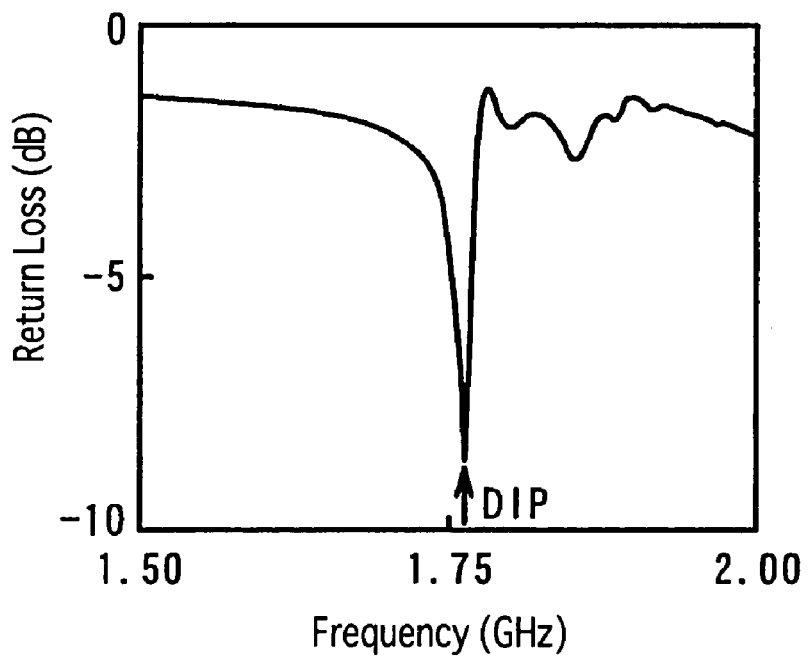
FIG. 13(b) is a graph showing reflection characteristics viewed from the connection point IP1 when the high-frequency switch is connected to the SAW filter via a capacitor.
Figure 13C:
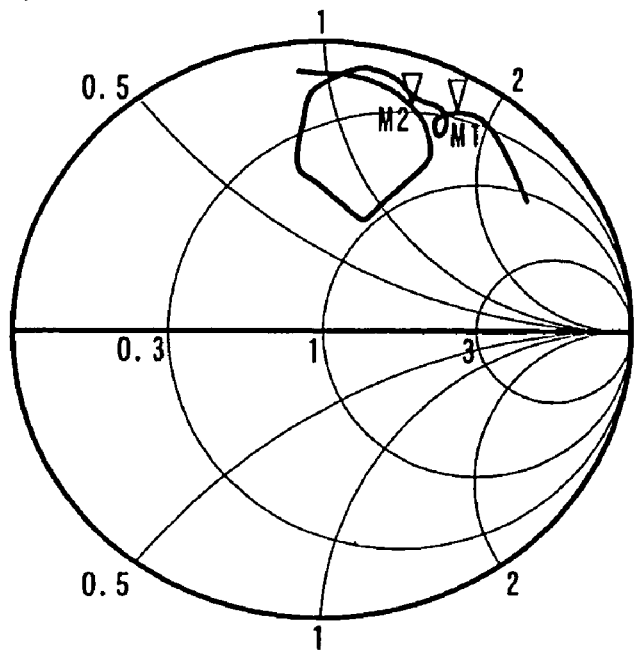
FIG. 13(c) is a Smith chart showing impedance characteristics when the high-frequency switch is connected to the SAW filter via a capacitor.
Figure 13D:
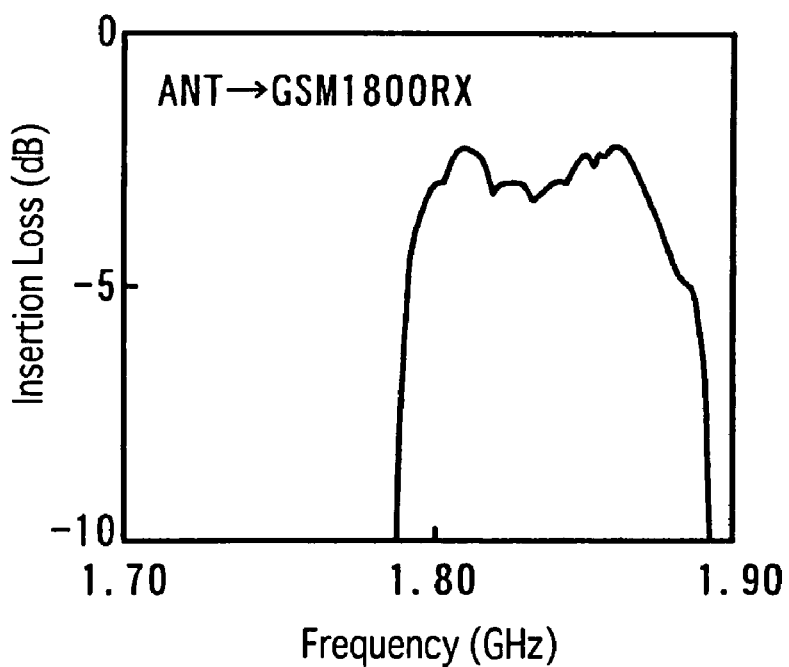
FIG. 13(d) is a graph showing insertion loss characteristics from ANT to GSM1800 RX when the high-frequency switch is connected to the SAW filter via a capacitor.
Figure 14A:
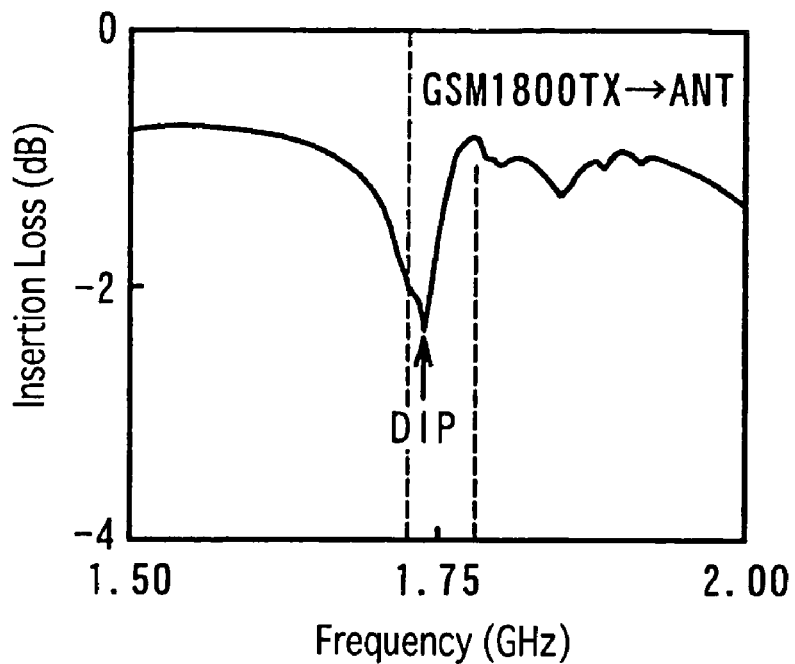
FIG. 14(a) is a graph showing insertion loss characteristics from GSM1800 TX to ANT when the high-frequency switch is connected to the SAW filter via a capacitor.
Figure 14B:
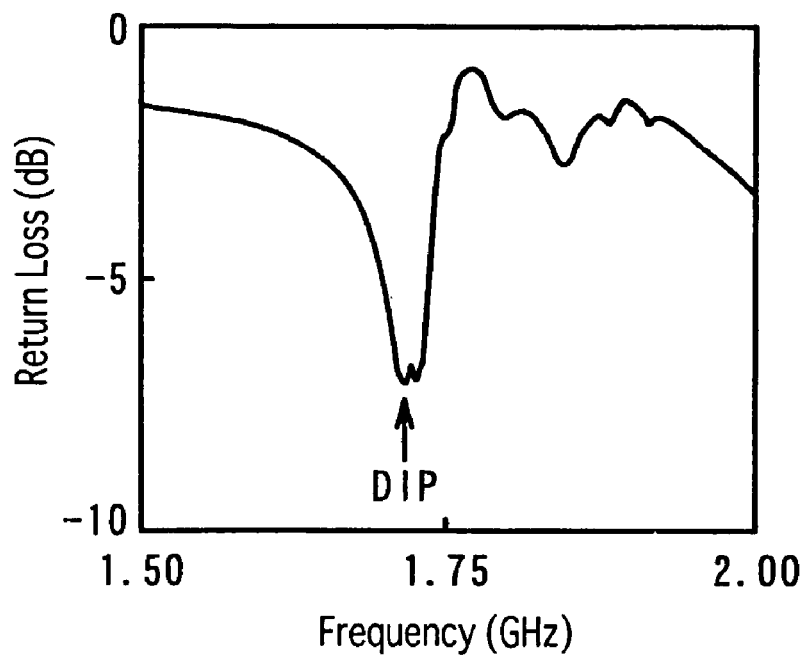
FIG. 14(b) is a graph showing reflection characteristics viewed from the connection point IP1 when the high-frequency switch is connected to the SAW filter via a capacitor.
Figure 14C:
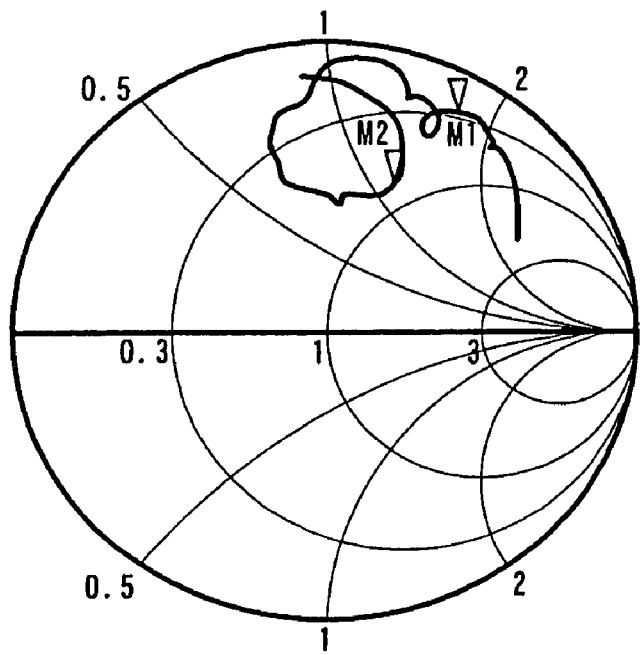
FIG. 14(c) is a Smith chart showing impedance characteristics when the high-frequency switch is connected to the SAW filter via a capacitor.
Figure 14D:
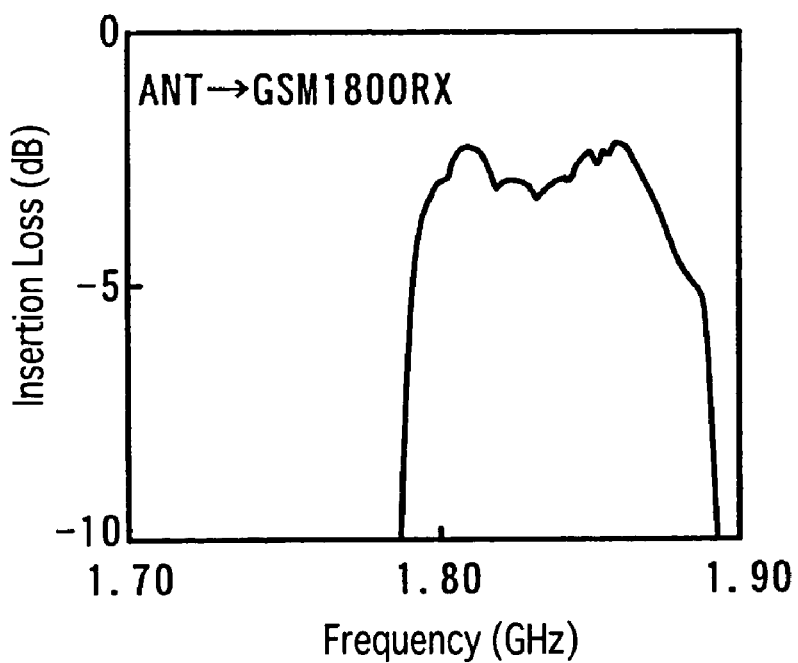
FIG. 14(d) is a graph showing insertion loss characteristics from ANT to GSM1800 RX when the high-frequency switch is connected to the SAW filter via a capacitor.

In the high-frequency switch module shown in FIG. 2, the evaluation of impedance ZIP1 on the receiving circuit side from a connection point IP1 of a transmission line and a receiving line at the time of transmission in the equivalent circuit shown in FIG. 7 using a circuit simulator has revealed that a Smith chart showing impedance characteristics on the side of the receiving circuit of the high-frequency switch forms a rotation locus in a transmission frequency band. Thus, the existence of a transmitting frequency on the rotation locus of impedance characteristics leads to small reflection loss, so that impedance when the receiving circuit RX side is viewed from the connection point IP1 is close to characteristic impedance. In other words, sufficient isolation cannot be obtained between the transmitting circuit TX and the receiving circuit RX, resulting in dip in the insertion loss, so that insertion loss characteristics from the transmitting circuit to the antenna are deteriorated.

As a result of further investigation, it has been found that such phenomenon is largely influenced by parasitic inductance generated by connecting wires of switching elements constituting the switch circuit (diodes or field effect transistors), etc. For instance, an equivalent circuit at the time of operating the diode is constituted by an inductor as shown by DD2 in FIG. 7, a capacitor and a resistor, and an inductor connected in series to the ground generates parasitic inductance.

By equivalently changing the parasitic inductance by a circuit simulator using a high-frequency circuit analysis tool (Advanced Design System of Agilent Technologies), its influence has been evaluated. As a result, it has been found that decrease in the parasitic inductance results in a small circular rotation locus of impedance, accompanied by improvement in reflection characteristics. However, because an actual parasitic inductor is determined by the structure of the switching element, it is practically difficult to reduce the inductance freely like the circuit simulator. Incidentally, the circuit simulator used herein is to obtain the measured values of characteristics data in advance to carry out simulation based on the characteristics data, thereby obtaining evaluation close to results obtained by producing actual samples, with respect to elements constituting high-frequency switches and surface acoustic wave filters, etc.

Paying attention to the fact that insertion loss characteristics are not deteriorated by shifting a frequency generated by the dip to a level sufficiently separate from a transmitting frequency, the inventors have found that what is needed for such purpose is only to connect a phase shift circuit for shifting a phase between a high-frequency switch and a SAW filter.

In a preferred embodiment of the present invention, the high-frequency switch comprises a first switching element arranged between a transmitting circuit and an antenna, a first transmission line or inductor for grounding said first switching element on the transmitting circuit side, a second transmission line arranged between said antenna and said receiving circuit, and a second switching element for grounding said second transmission line on the receiving circuit side, said phase shift circuit is series-connected to said second transmission line. The phase shift circuit comprises a transmission line or a capacitor, which may be constituted by electrode patterns in a laminate comprising a plurality of dielectric layers each having the electrode pattern, or mounted on the laminate as a chip inductor or a chip capacitor.

The high-frequency switch module of the present invention preferably comprises a SAW filter with an unbalanced input and balanced output as a SAW filter to balance an RF circuit in a cell phone. When the SAW filter has different input and output impedances such that it functions as an impedance-converting circuit, an additional impedance-converting circuit may not be used in connection with other high-frequency parts such as LNA, etc., which is preferable in achieving improvement in electric characteristics and the miniaturization of an RF circuit. The arrangement of an inductor in the vicinity of a balanced output terminal of said surface acoustic wave filter in parallel to the balanced output terminal is preferable in reducing the ripple of a differential signal from the balanced output terminal for reasons described below.

The high-frequency switch module according to another embodiment of the present invention comprises a high-frequency switch circuit for switching a transmitting circuit and a receiving circuit of transmitting/receiving systems; and a balanced-to-unbalanced transforming circuit for connecting a balanced circuit and an unbalanced circuit, which is connected to the receiving system of said high-frequency switch circuit; said high-frequency switch circuit comprising a first switching element, a first transmission line and a first capacitor as main elements; at least part of said first transmission line and the first capacitor being constituted by electrode patterns in a laminate comprising dielectric layers each having the electrode pattern; and said balanced-to-unbalanced transforming circuit being mounted on the laminate as a surface acoustic wave filter (SAW filter) with unbalanced input and balanced output. By providing the surface acoustic wave filter with different input and output impedances, it may function as an impedance-converting circuit.

In the course of constituting the RF circuit of a cell phone as a composite structure to make it smaller and have higher performance, it has been found that the use of a balanced-output-type SAW filter and its connection to a balanced-input LNA make it possible to constitute the RF circuit without using a balanced-to-unbalanced transformer. The SAW filter is constituted by closely arranging a plurality of IDT (inter-digital transducer) electrodes on a main surface of a piezoelectric substrate along a surface wave propagation direction, and disposing reflectors on both sides of the IDT electrodes. Though a generally used SAW filter has a filter structure of an unbalanced type having one signal terminal, namely an unbalanced-to-unbalanced type, SAW filters having different input and output impedances and thus a balanced-to-unbalanced transformation function were put into practical use recently by devising the crossing width, arrangement and coupling of electrode fingers. If such SAW filters are mounted on a laminate constituting high-frequency switches, the SAW filters can be made composite with the high-frequency switches, taking into consideration their impedance matching, without deteriorating their electric performance. Also, when SAW filters having a balanced-to-unbalanced transformation function are connected to balanced-input-type circuit elements, improvement in electric characteristics and the miniaturization of an RF circuit can be achieved, if the SAW filters are selected in accordance with the input impedance and output impedance of circuit elements such as LNA, etc., such that the RF circuit functions as a balanced-to-unbalanced transforming circuit.

When the SAW filter is connected to a low-noise amplifier LNA, the low-noise amplifier LNA would easily be influenced by external noises, if there were good balance in amplitude and phase in an input signal to the LNA, causing troubles such as oscillation, etc. Accordingly, it is preferable that the amplitude balance is within ±1 dB, and that the phase balance is within 180±10 deg. Incidentally, the amplitude balance is electric power difference between balanced terminals at a high frequency, and the phase balance shows its phase difference.

When the SAW filter having the above balance characteristics is mounted on a circuit board and connected to a low-noise amplifier via a connection line, the connection line needs to be as long as about 3-5 mm, generating parasitic inductance and capacitance. The SAW filter also has parasitic inductance and capacitance due to lead wires for wire bonding and a molding resin. Accordingly, ripple is generated in a balanced output signal in a receiving frequency band, resulting in the deterioration of insertion loss characteristics in a pass band region and thus failing to obtaining the desired amplitude balance and phase balance. However, if the SAW filter is mounted on the laminate as a composite structure with the high-frequency switch, their impedance matching would be so easy that the balanced output terminal of the SAW filter can be connected by a transmission line formed in the laminate to a circuit board on which the high-frequency switch module is mounted. Accordingly, by properly setting the line length, etc. of the transmission line, the phase balance and amplitude balance of a differential output signal from the balanced output terminal can be adjusted in a desired range. Further, by arranging an inductor in the vicinity of the balanced output terminal of the SAW filter in parallel thereto, ripple due to parasitic impedance such as parasitic capacitance and parasitic inductance in a receiving frequency band can preferably be suppressed.

The SAW filter is connected to an inductor arranged in parallel to the balanced output terminal of the SAW filter via a connection line formed in the laminate. Though the connection line is formed by an electrode pattern like other transmission lines, etc., it is a line substantially free from a circuit function such as inductance, etc. in an equivalent circuit. An inductor arranged in parallel to the balanced output terminal of the SAW filter is a chip inductor, which may be mounted on the laminate, or formed in the laminate by a transmission line in a coil-like, meandering or spiral shape.

Figure 35:
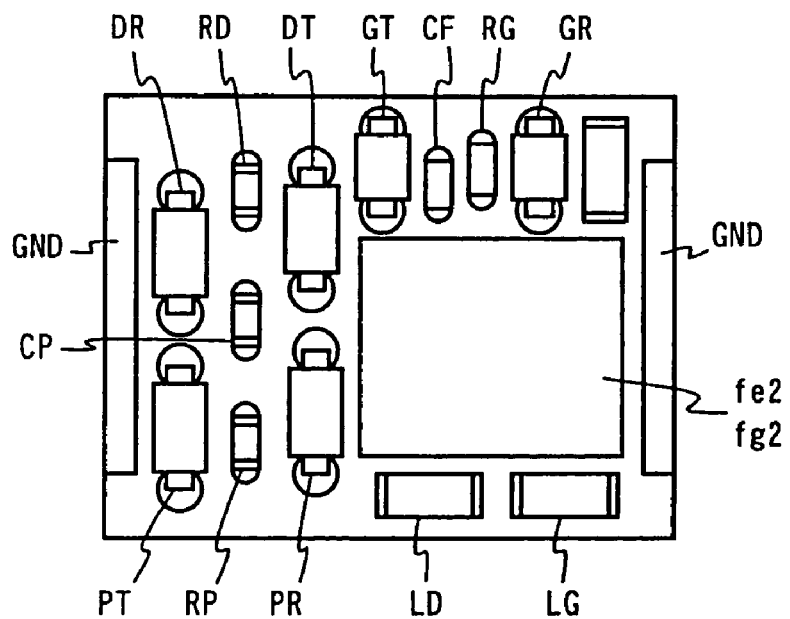
FIG. 35 is a plan view showing the high-frequency switch module of the present invention a still further embodiment.
Figure 36:
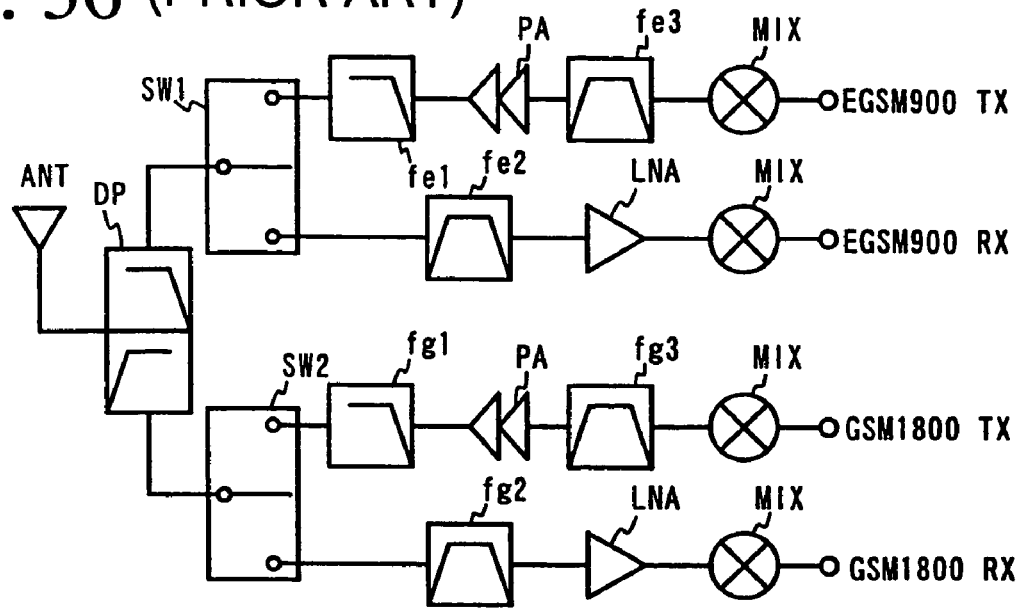
FIG. 36 is a block diagram showing one example of an RF circuit in a multi-band mobile phone.
Figure 37:
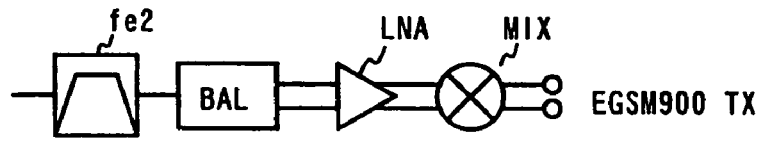
FIG. 37 is a block diagram showing one example of an RF circuit comprising a balanced-input-type, low-noise amplifier LNA.
Figure 38:
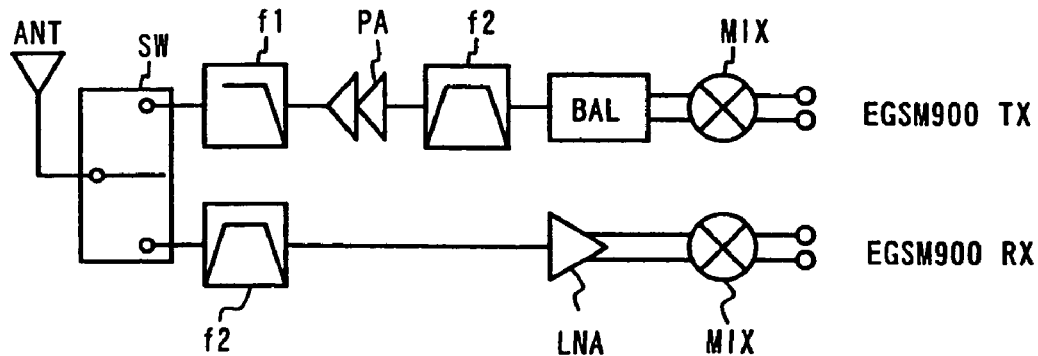
FIG. 38 is a block diagram showing one example of an RF circuit in a single-band mobile phone.

As a result of various investigations, it has been found that preferable to cause the parallel-arranged inductor to exhibit a ripple-suppressing effect is to arrange the inductor in the extreme vicinity of the balanced output terminal to make parasitic impedance smaller, and to connect the SAW filter and the inductor in parallel thereto by a connection line on an insulating substrate. As shown in FIG. 35, for instance, by closely arranging balanced-output SAW filters fe2, fg2 and inductors LG, LD in one laminate, it is possible to reduce the length of a line pattern for connecting the SAW filters fe2, fg2 and the inductors LG, LD, thereby making smaller a parasitic impedance component between the output terminals of the SAW filters fe2, fg2 and the inductors LG, LD arranged in parallel thereto.

The inductors and the surface acoustic wave filters are connected by connection lines formed in the laminate. The inductors may be mounted on the laminate as chip inductors, or may be formed by transmission lines in a coil-like, meandering or spiral shape in the laminate.

The high-frequency switch module according to another embodiment of the present invention comprises a high-frequency switch circuit for switching a transmitting circuit and a receiving circuit of a transmitting/receiving system; a SAW filter connected to a receiving system of said high-frequency switch circuit; and a balanced-to-unbalanced transforming circuit connected to said SAW filter; said high-frequency switch circuit comprising a switching element, a first transmission line and a first capacitor as main elements, at least part of said first transmission line and the first capacitor is constituted by electrode patterns in a laminate; said balanced-to-unbalanced transforming circuit being a balanced-to-unbalanced transformer (balun) comprising a second transmission line as a main element; and said second transmission line being constituted by said electrode pattern.

Though the SAW filter is used as an impedance-converting circuit, it is preferable that when necessary impedance is not obtained, the SAW filter is provided with unbalanced input and unbalanced output, using a balanced-to-unbalanced transformer (balun) as a balanced-to-unbalanced transforming circuit and an impedance-converting circuit. The balanced-to-unbalanced transformer (balun) is constituted integrally with the high-frequency switch and the SAW filter in the laminate. However, when transmission lines for the balanced-to-unbalanced transformer are contained in a limited area of the laminate, the transmission lines may not have necessary length, making it likely that a desired turns ratio is not obtained, and that transmission lines are not easily made symmetric on the balanced side. In such a case, necessary input and output impedance, phase balance and amplitude balance may not be obtained. If so, a capacitor may be arranged between a transmission line on the input side and a ground, or a capacitor may be arranged between the balanced output terminals, followed by proper adjustment thereof.

Such capacitors may be contained as electrode patterns in the laminate, or may be mounted as chip capacitors on the laminate. The balanced-to-unbalanced transformer (balun) preferably shares a ground with other circuit parts such as a high-frequency switch, etc. Particularly when the ground on the balanced side is common to the ground of other circuit parts, a phase is 0° when viewed from the common ground.

In a preferable embodiment of the present invention, the laminate is preferably in a shape of a plate having opposing main surfaces and side surfaces connected to said main surfaces, the surface acoustic wave filters being mounted face-down as bare chips on at least one main surface. Preferably usable for the transmission lines are strip lines, microstrip lines, coplanar lines, etc.

[1] Combination of High-Frequency Switch Circuit and Surface Acoustic Wave Filter as a Composite Structure FIG. 1 shows one example of a circuit for the high-frequency switch module of the present invention, and FIG. 2 shows one example of its equivalent circuit. This high-frequency switch module comprises a phase shift circuit LD4 between a high-frequency switch SW and a SAW filter f2, and these parts are formed in a composite structure.

FIG. 8 shows the electric characteristics of one example of the high-frequency switch module of Comparative Example, in which a high-frequency switch and a SAW filter are connected without a phase shift circuit. It is clear from FIG. 8(a) that there is dip in insertion loss characteristics at 1.7 GHz near a transmitting frequency of GSM1800, resulting in the deterioration of insertion loss in a transmitting frequency band.

To prevent such deterioration of insertion loss characteristics, a phase shift circuit constituted by at least one of a transmission line, an inductor and a capacitor is series-connected between the high-frequency switch and the surface acoustic wave filter in the present invention. Electric characteristics when various phase shift circuits are connected are shown in FIGS. 9-14. The insertion loss characteristics and the phase characteristics are shown in Table 1.

TABLE 1

| Char-acter-istics | Frequency | No Phase Shift Circuit | Transmission Line | |
|---|---|---|---|---|
| | | | L = 1 mm W = 0.14 mm | L = 2 mm W = 0.14 mm |
| Insertion Loss | 1.71 GHz | 1.80 dB | 0.75 dB | 0.66 dB |
| | 1.785 GHz | 0.90 dB | 0.72 dB | 0.72 dB |
| Dip Frequency | | 1.7 GHz | 1.65 GHz | 1.58 GHz |
| Phase | 1.71 GHz | 108.2° | 94.3° | 87.3° |
| | 1.785 GHz | 72.6° | 72.2° | 71.7° |

| Char-acter-istics | Frequency | Inductor | | Capacitor | |
|---|---|---|---|---|---|
| | | L = 0.5 nH | L = 1 nH | C = 0.5 pF | C = 15 pF |

TABLE 1-continued

| Insertion Loss | 1.71 GHz | 0.77 dB | 0.67 dB | 0.75 dB | 1.95 dB |
|---|---|---|---|---|---|
| | 1.785 GHz | 0.72 dB | 0.71 dB | 0.75 dB | 0.72 dB |
| Dip Frequency | | 1.66 GHz | 1.59 GHz | 1.77 GHz | 1.74 GHz |
| Phase | 1.71 GHz | 95.0° | 87.9° | 68.0° | 66.9° |
| | 1.785 GHz | 72.3° | 71.9° | 74.4° | 73.2° |

FIGS. 9 and 10 show the electric characteristics of the high-frequency switch module when transmission lines having a width of 0.14 mm and lengths L of 1 mm and 2 mm, respectively, are formed as phase shift circuits. As shown in FIGS. 9(c) and 10(c), it is clear that the longer the phase shift circuit, the smaller the rotation locus of impedance. FIGS. 9(b) and 10(b) show reflection characteristics (return loss) when the receiving circuit RX side is viewed from the connection point IP1. The formation of the phase shift circuit slightly forwards a phase and shifts a frequency at which there is small reflection loss toward a lower side with its absolute value decreased.

FIGS. 11 and 12 show the electric characteristics of the high-frequency switch module when a lumped-constant inductor (chip inductor with inductance L of 0.5 nH and 1 nH, respectively) is formed as a phase shift circuit. As shown in FIGS. 11(c) and 12(c), it is clear that the larger the inductance, the smaller the rotation locus of impedance. FIGS. 11(b) and 12(b) show reflection characteristics (return loss) when the receiving circuit RX side is viewed from the connection point IP1. The formation of the phase shift circuit slightly forwards a phase and causes a frequency at which there is a large reflection loss to shift toward a lower side with its absolute value decreased.

FIGS. 13 and 14 show electric characteristics when a chip capacitor with capacitance C of 5 pF and 15 pF, respectively is formed as a phase shift circuit. As shown in FIGS. 13(b) and 14(b), the smaller the capacitance of the chip capacitor, a phase lags slightly, and a frequency at which the high-frequency switch module exhibits large reflection characteristics shifts toward a higher side.

FIGS. 9(d)-14(d) show insertion loss characteristics from the antenna to the receiving circuit in the above high-frequency switch module. It has been found that even with the phase shift circuit provided between the high-frequency switch and the SAW filter, the insertion loss characteristics from the antenna to the receiving circuit are not deteriorated.

Figure 3:
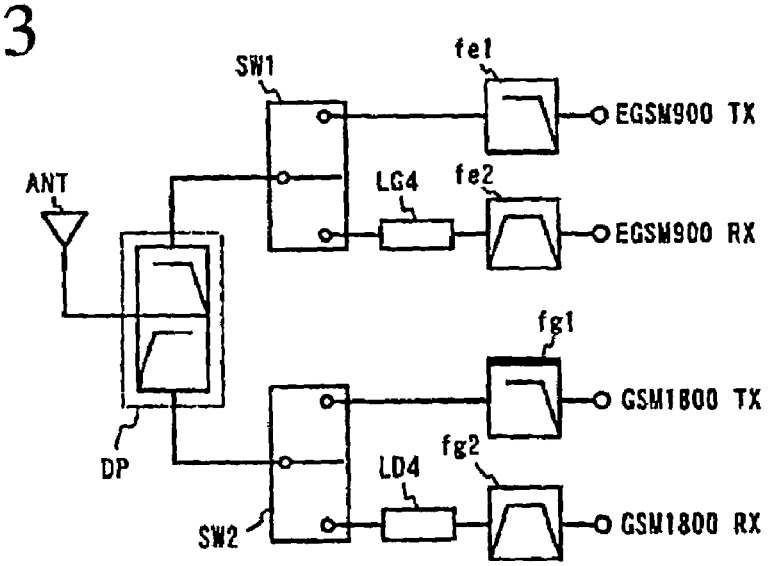
FIG. 3 is a block diagram showing the circuit of the high-frequency switch module according to another embodiment of the present invention.

FIGS. 3-6 show the high-frequency switch modules in detail according to another embodiment of the present invention. This high-frequency switch module comprises a single multi-connection system for handling two different communications systems, a first transmitting/receiving system being EGSM900 (transmitting frequency: 880-915 MHz, receiving frequency: 925-960 MHz), and b second transmitting/receiving systems being GSM1800 (transmitting frequency: 1710-1785 MHz, receiving frequency: 1805-1880 MHz). FIG. 3 shows a circuit block in a case where the high-frequency switch module of the present invention is used for an RF circuit for a dual-band mobile phone handling two transmitting/receiving systems. This high-frequency switch module comprises a diplexer (DP) constituted by a low-pass filter and a high-pass filter, to branch a terminal connected to ANT to a first transmitting/receiving system (for instance, EGSM900) on a lower frequency side, and a second transmitting/receiving system (for instance, GSM1800 having a frequency band substantially two times that of EGSM900) on a higher frequency side.

Provided on the downstream of the diplexer (DP) on the low-pass filter is a first high-frequency switch SW1 for switching a line for connecting a transmitting circuit (EGSM900 TX) of a first transmitting/receiving system (EGSM900) and the diplexer, and a line for connecting a receiving circuit (EGSM900 RX) of the first transmitting/ receiving system and the duplexer. Also provided on the downstream of the diplexer on the high-pass filter side is a second high-frequency switch SW2 for switching a line for connecting a receiving circuit (GSM1800 RX) of a second transmitting/receiving system and the diplexer, and a line for connecting a transmitting circuit (GSM1800 TX) of the second transmitting/receiving system and the diplexer. A low-pass filter fe1, fg1 is arranged between each high-frequency switch SW1, SW2 and each transmitting circuit; a SAW filter fe2, fg2 is arranged between the first high-frequency switch and the receiving circuit; a phase shift circuit LG4 is arranged between the first high-frequency switch SW1 and the SAW filter fe2; and a phase shift circuit LD4 is arranged between the second high-frequency switch SW2 and the SAW filter fg2.

Figure 4:
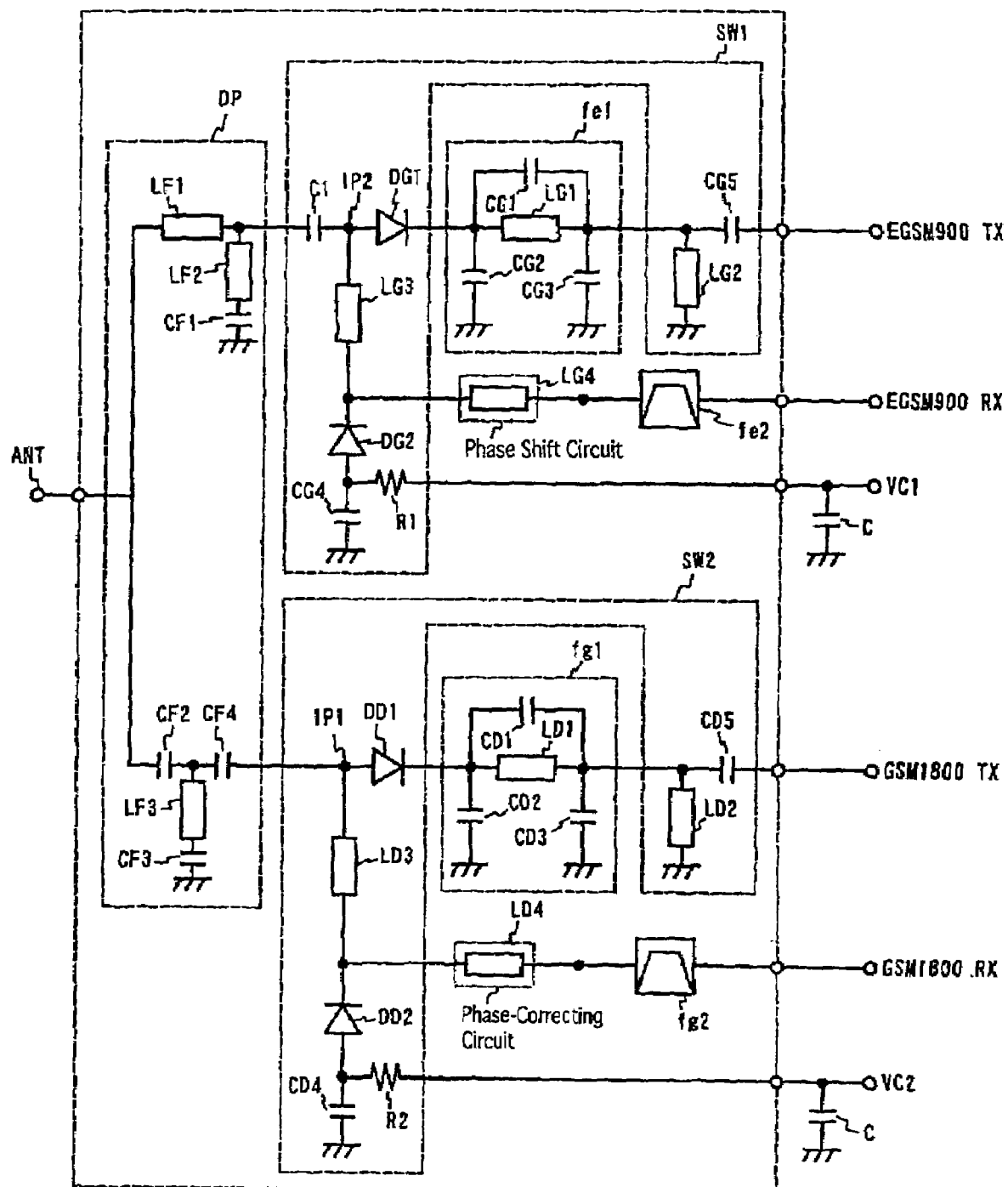
FIG. 4 is a view showing one example of the equivalent circuit of the high-frequency switch module shown in FIG. 3.

FIG. 4 shows one example of the equivalent circuit of the high-frequency switch module used in the above dual-band mobile phones. Capacitors C outside the broken line in FIG. 4 are arranged on a circuit board as external parts, though these external parts may be formed inside the laminate described later or mounted on the laminate.

The diplexer DP connected to the antenna ANT comprises two series resonance circuits, one notch circuit constituted by a transmission line LF2 and a capacitor CF1, and another notch circuit constituted by a transmission line LF3 and a capacitor CF3. One notch circuit is connected to one end of a transmission line LF1 disposed on the downstream of the antenna ANT for functioning as a low-pass filter, such that it is arranged between the transmission line LF1 and a ground on the downstream of the transmission line LF1.

Another notch circuit is connected to a capacitor CF2 disposed on the downstream of the antenna ANT for functioning as a high-pass filter, such that it is arranged between one end of the capacitor CF2 and the ground on the downstream of the capacitor CF2. To improve the high-pass filter characteristics, a capacitor CF4 is connected to the capacitor CF2 in series. The capacitor CF4 also functions as a DC-cutting capacitor for the second high-frequency switch SW2. By this structure, the diplexer DP can show wide-band insertion loss characteristics in a desired frequency band, and large attenuation characteristics in an unnecessary frequency band, so that it functions as a diplexer having excellent branching characteristics.

The first high-frequency switch SW1 switches a transmitting circuit EGSM900 Tx and a receiving circuit EGSM900 RX. The high-frequency switch SW1 comprises two diodes DG1, DG2 and two transmission lines LG2, LG3 as main constituents, the diode DG1 having an anode connected to the antenna ANT and a cathode connected to the transmitting circuit EGSM900 TX. The cathode of the diode DG1 is also connected to a grounded transmission line LG2. A transmission line LG3 is connected between the antenna ANT and the receiving circuit EGSM900 RX. The cathode of the diode DG2 is connected to the transmission line LG3 on the receiving side, and a capacitor CG4 is connected between the anode of the diode DG2 and the ground, with a diode-controlling voltage terminal VC1 arranged via a resistor R therebetween.

In a transmission system (on the side of transmitting circuit EGSM900 TX), a low-pass filter fe1 constituted by a transmission line LG1 and capacitors CG1, CG2, CG3 is inserted between the diode and DG1 and the transmission line LG2 of the first high-frequency switch SW1. The low-pass filter fe1 may be arranged between the transmission circuit EGSM900 TX and the transmission line LG2. A phase shift circuit LG4 is connected to the cathode of the diode DG2 via a SAW filter fe2. A DC-cutting capacitor C1 is arranged between the first high-frequency switch SW1 the transmission line LF1 of the diplexer DP.

The second high-frequency switch SW2 functioning to switch a transmitting circuit GSM1800 TX and a receiving circuit GSM1800 RX comprises two diodes DD1, DD2 and two transmission lines LD2, LD3 as main constituents. The diode DD1 has an anode connected to the antenna ANT side and a cathode connected to the side of the transmitting circuit GSM1800 TX. A grounded transmission line LD2 is connected to the cathode of the diode DD1. A transmission line LD3 is connected between the antenna ANT and the receiving circuit GSM1800 RX, and the cathode of the diode DD2 is connected to the receiving side of the transmitting line LD3. A capacitor CD4 is connected between the anode of the diode DD2 and the ground, and a diode-controlling voltage terminal VC2 is arranged therebetween via a resistor R.

In a transmission system (on the side of transmitting circuit GSM1800 TX), a low-pass filter fg1 comprising a transmission line LD1 and capacitors CD1, CD2, CD3 is inserted between the diode DD1 and the transmission line LD2 of the high-frequency switch SW. The low-pass filter fg1 may be arranged between the transmitting circuit TX and the transmission line LD2. A SAW filter fg2 is connected to the cathode side of the diode DD2 via a phase-correcting circuit LD4.

The operation logic of this high-frequency switch module is shown in Table 2. For instance, when a transmitting signal of GSM1800 is sent to the antenna ANT in this high-frequency switch module, by applying positive voltage from a voltage control circuit VC2 to switch the second high-frequency switch SW2, the diodes DD1 and DD2 are set in an ON state. Because the diode DD2 in an ON state has low impedance, the transmission line LD3 is grounded at a high frequency, and impedance at a transmitting frequency is high due to a transmission line constituting a phase shift circuit LD4 when the receiving circuit GSM1800 RX is viewed from the common terminal IP1, resulting in no high-frequency signal (transmitting signal) appearing in the receiving circuit GSM1800 RX. Also, because the diode DD1 in an ON state has low impedance, a high-frequency signal from the transmitting circuit GSM1800 TX passes through the diplexer DP, and emitted from the antenna ANT as a transmitting signal of GSM1800 TX.

TABLE 2

| Mode | VC1 | VC2 | DG1 | DG2 | DD1 | DD2 |
| --- | --- | --- | --- | --- | --- | --- |
| EGSM900 TX | High | Low | ON | ON | OFF | OFF |
| EGSM900 RX | Low | Low | OFF | OFF | OFF | OFF |
| GSM1800 TX | Low | High | OFF | OFF | ON | ON |
| GSM1800 RX | Low | Low | OFF | OFF | OFF | OFF |

In this embodiment, the SAW filters fe2, fg2 are in an unbalanced output type. However, when a low-noise amplifier LNA with balanced signal input is arranged on the downstream of the SAW filter in a receiving circuit of a mobile phone, the SAW filter may be a SAW filter with balanced output. To improve electric characteristics, an inductor is preferably arranged in parallel between the balanced outputs of the SAW filter. The inductor may be mounted on the laminate as a chip inductor, or arranged in the laminate like other transmission lines.

Figure 5:
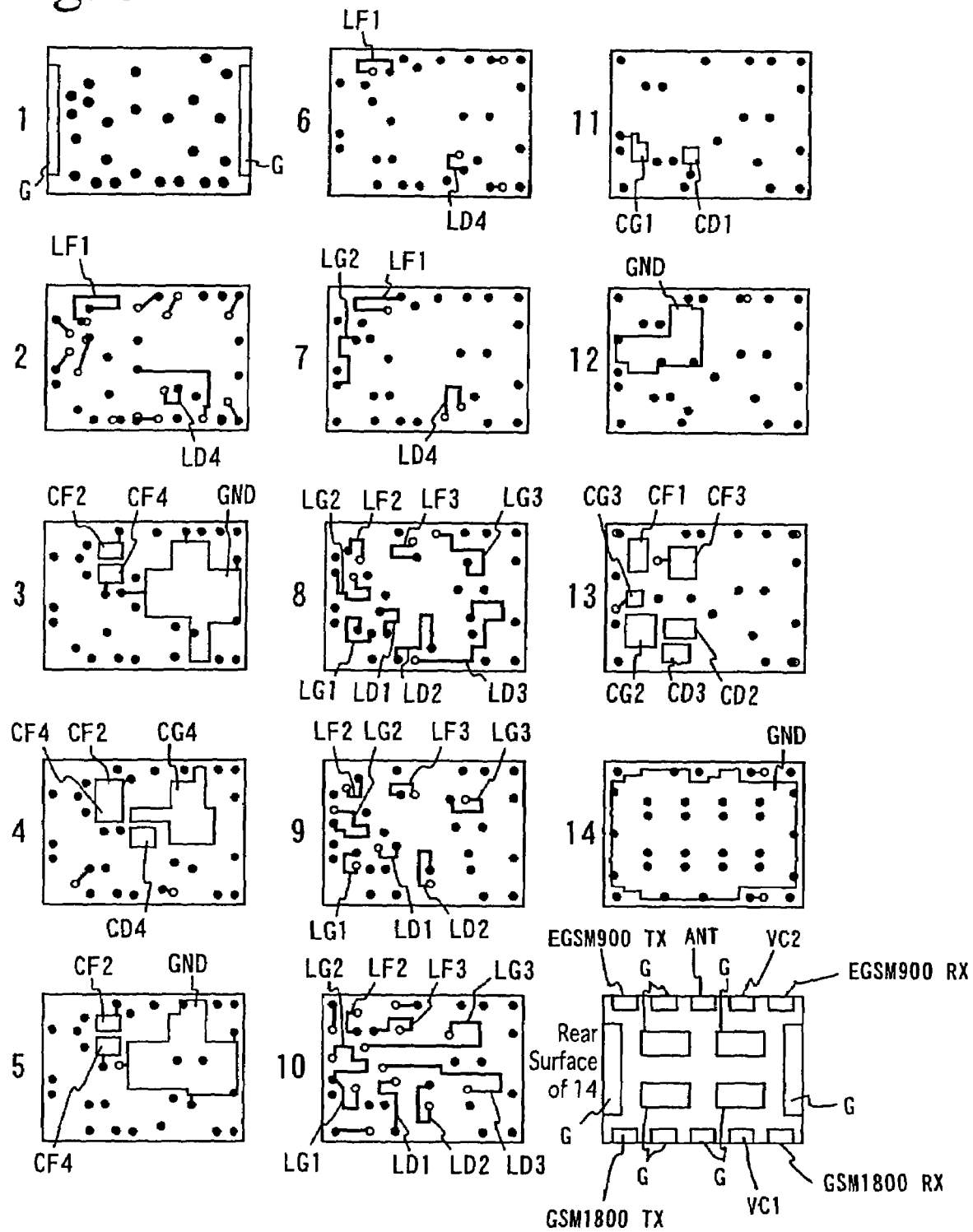
FIG. 5 is a view showing one example of an electrode pattern in each layer in a laminate constituting the high-frequency switch module of FIG. 4.
Figure 6:
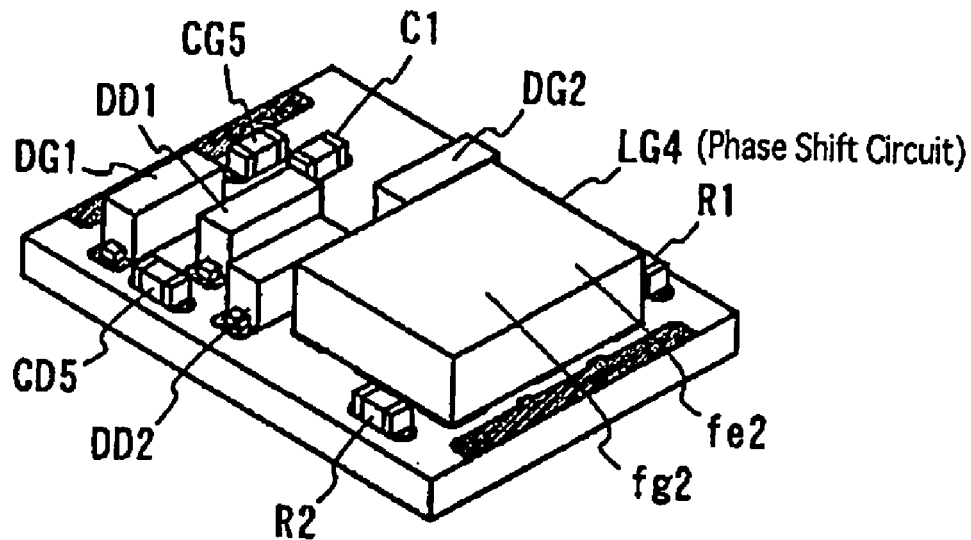
FIG. 6 is a perspective view showing the high-frequency switch module according to one embodiment of the present invention.

One example of the internal structure of the high-frequency switch module having the equivalent circuit shown in FIG. 4 is shown in FIG. 5. FIG. 6 shows a high-frequency switch module on which a SAW filter and diodes are mounted. This high-frequency switch module comprises transmission lines constituting the diplexer DP, the low-pass filters fe1, fg1, and the high-frequency switches SW1, SW2 in the laminate, with the diodes, the chip capacitors, the SAW filters fe2, fg2, and the chip resistors mounted on the laminate, thereby having a one-chip structure as a whole.

The laminate of the high-frequency switch module is formed by printing an Ag-based conductive paste on each low-temperature-sinterable, dielectric ceramic green sheet to form a desired electrode pattern, integrally laminating a plurality of green sheets each having an electrode pattern properly, and then sintering the laminate.

The low-temperature-sinterable, dielectric ceramic materials may be dielectric materials such as low-temperature-sintered dielectric ceramic compositions comprising, for instance, $Al_2O_3$ as a main component and at least one of $SiO_2$, $SrO$, $CaO$, $PbO$, $Na_2O$ and $K_2O$ as an additional component and low-temperature-sinterable, dielectric ceramic compositions comprising $Al_2O_3$ as a main component and at least one of $MgO$, $SiO_2$ and $GdO$ as an additional component, magnetic ceramic materials containing at least one of $Bi_2O_3$, $Y_2O_3$, $CaCO_3$, $Fe_2O_3$, $In_2O_3$ and $V_2O_5$, etc. These dielectric ceramic materials as starting materials are wet-mixed by a ball mill, and after the resultant slurry is dried, it is calcined at a temperature of 700° C.-850° C., pulverized and dried to provide ceramic powder. This ceramic powder is mixed with an organic binder, a plasticizer and an organic solvent in a ball mill, and after adjusting the viscosity of the resultant mixture in a defoaming machine, it is formed into a ceramic green sheet of 30-250 μm in thickness by a known sheet-forming method using a doctor blade, a pipe doctor, etc.

Each green sheet is printed with a conductive paste of Cu, Ag, etc. to form an electrode pattern constituting transmission lines, capacitors and connection lines, and provided with via-holes for connecting the electrode patterns. The resultant green sheets with electrode patterns are laminated, and subjected to thermal pressing at a temperature of 80° C. and at a pressure of 12 MPa to form a laminate. The resultant laminate is cut to predetermined size and shape by a dicing saw, a steel blade, etc., and sintered at 900° C.-1000° C. for 2-8 hours. Thus obtained is, for instance, a laminate having a size of 6.7 mm×5.0 mm×0.6 mm.

The internal structure of the laminate will then be explained according to the following lamination order. First, formed on a lower surface of a green sheet 14, a lowermost layer, is a ground electrode and terminal electrodes. An upper surface of the green sheet 14 is provided with a ground electrode on a substantially entire surface, with via-holes of 0.05-0.2 mm in diameter (shown by black circles in the figure) formed to properly connect electrode patterns. These via-holes are filled with a conductor such as Ag, Cu, etc.

Formed on a green sheet 13 are capacitors for constituting the duplexer and the low-pass filter, which are grounded, and formed on green sheets 12 and 11 are capacitors for constituting the ground electrode GND and the low-pass filter LPF. Formed on green sheets 6-10 are transmission lines for constituting the high-frequency switches, the duplexer and the low-pass filters, and a transmission line LD4 as a phase shift circuit.

Formed on green sheets 3-5 are the ground electrode, capacitors for the diplexer and capacitors connected to the ground of the high-frequency switch.

Formed on a green sheet 2 are a wiring pattern connected to a land formed on the uppermost green sheet 1, on which elements are mounted, and a transmission line LD4 constituting the phase-correcting circuit. The transmission line LD4 is connected to the SAW filter fg2 mounted on the laminate.

Formed on an upper surface of the laminate are a land for connecting the mounted elements and a land for connecting a metal casing. Mounted on the upper surface of the laminate are four diodes, two SAW filters, chip resistors and chip capacitors. After the laminate is covered by a metal casing made of a Ni-clad material, soldering is carried out to provide the high-frequency switch module of the present invention. Among said chip capacitors, LG4 is used for the phase shift circuit. Incidentally, the metal casing is not shown in FIG. 6 to clarify how parts are mounted.

Though a single device comprising elements sealed in a metal casing, a so-called pipe-sealing package-type SAW filter, is used as the SAW filter in the above embodiment, a bare chip constituting the SAW filter may be bonded to at least one surface of the laminate, or part of the laminate may be provided with a cavity, in which the SAW filter is arranged. When the SAW filter is mounted in a bare state, it is preferably sealed by a metal casing, and if necessary, the SAW filter may be surrounded by an inert atmosphere of an argon gas or a nitrogen gas.

Figure 15A:
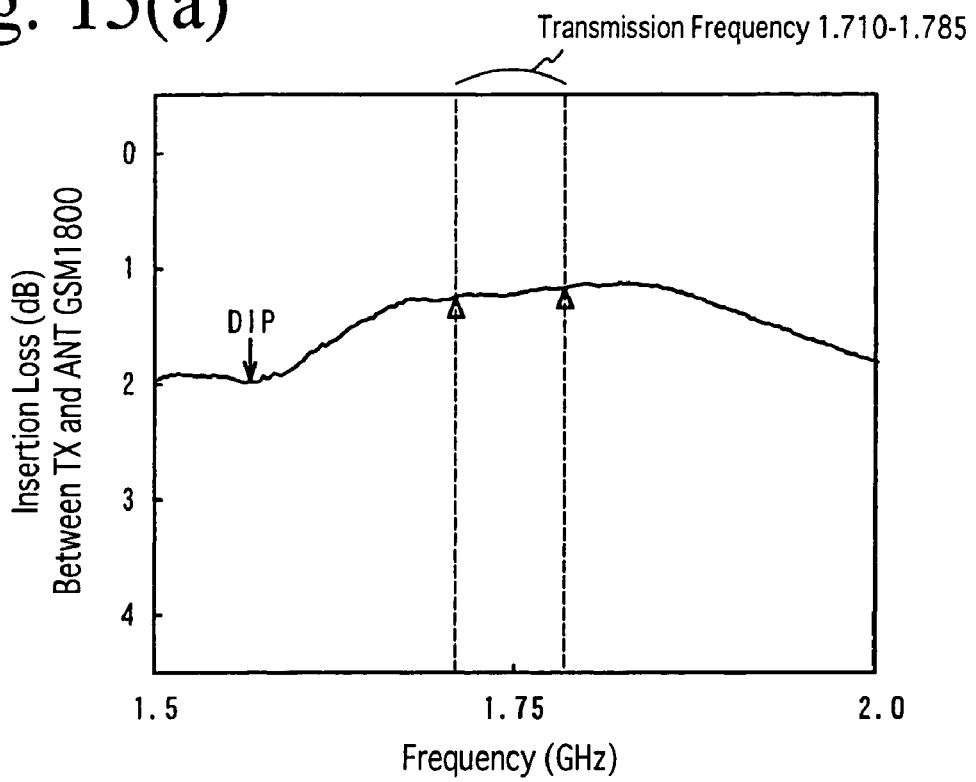
FIG. 15(a) is a graph showing insertion loss characteristics between GSM1800 TX and the antenna ANT in the high-frequency switch module of the present invention.
Figure 15B:
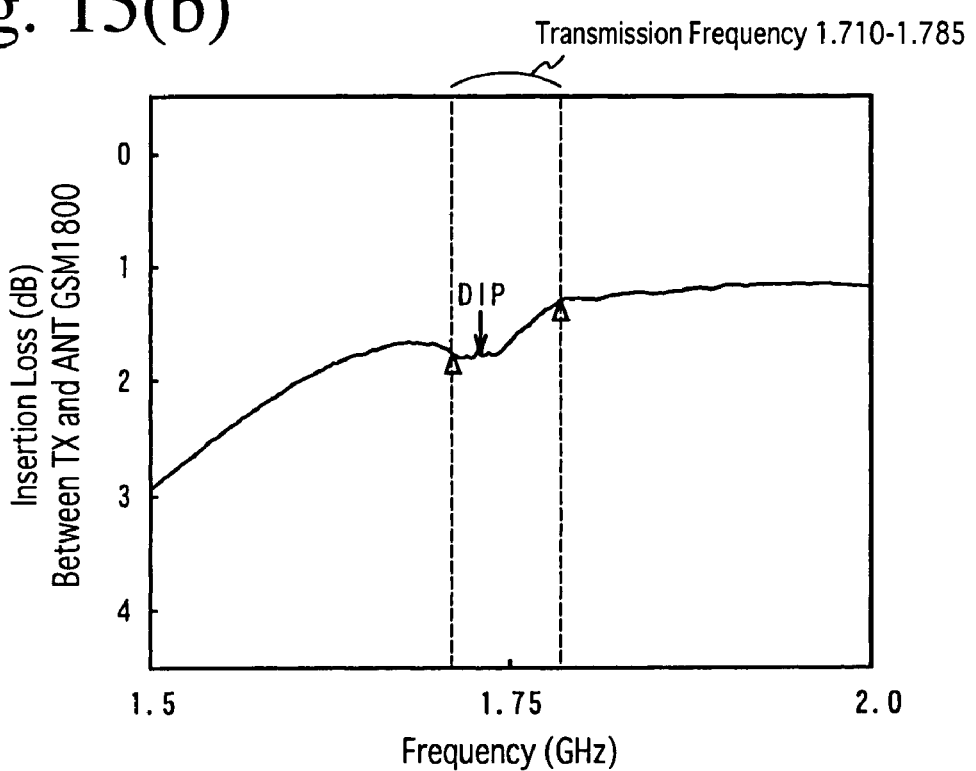
FIG. 15(b) is a graph showing insertion loss characteristics between GSM1800 TX and the antenna ANT in a conventional high-frequency switch module.

In the high-frequency switch module thus produced, insertion loss characteristics between GSM1800 TX and the antenna ANT were evaluated. Also, as Comparative Example, a high-frequency switch module comprising a high-frequency switch and a SAW filter connected simply through a via-hole without a transmission line LD4 was produced. FIG. 15(a) shows insertion loss characteristics between GSM1800 TX and the antenna ANT in the high-frequency switch module of the present invention, and FIG. 15(b) shows insertion loss characteristics between GSM1800 TX and the antenna ANT in the conventional high-frequency switch module.

According to the present invention, the position of the dip in the insertion loss characteristics can be shifted from the transmitting frequency of GSM1800 toward a sufficiently lower frequency. Also, as compared with the conventional high-frequency switch module, the loss was reduced by about 0.8 dB. The receiving insertion loss was at most 3.2 dB in the same receiving signal band as the conventional one.

Though the phase shift circuit LD4 is arranged between the second high-frequency switch SW2 on the side of GSM1800 and the SAW filter fg2 in the above embodiment, the phase shift circuit LD4 may be properly arranged between the first high-frequency switch SW1 on the side of EGSM900 and the SAW filter fe2. The same results are obtained also when a chip inductor is used as the phase shift circuit LD4. Further, when a capacitor is used as the phase shift circuit LD4, said dip can be shifted toward a higher frequency side, resulting in effective improvement in the insertion loss characteristics of a transmitting signal similarly.

[2] First Example of Obtaining Balanced Output in High-Frequency Switch Module

Figure 16:
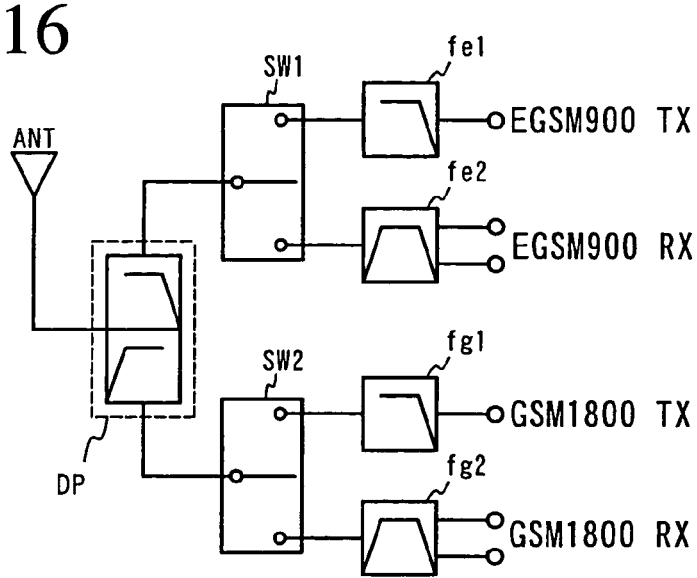
FIG. 16 is a block diagram showing the circuit of the high-frequency switch module according to another embodiment of the present invention.

Detailed explanation will be made below on a high-frequency switch module having the circuit shown in FIG. 16, which handles two different communications systems by a single multi-connection system, under the setting that the first transmitting/receiving system is EGSM900 (transmitting frequency: 880-915 MHz, receiving frequency: 925-960 MHz), and the second transmitting/receiving systems is GSM1800 (transmission frequency: 1710-1785 MHz, receiving frequency: 1805-1880 MHz).

Figure 17:
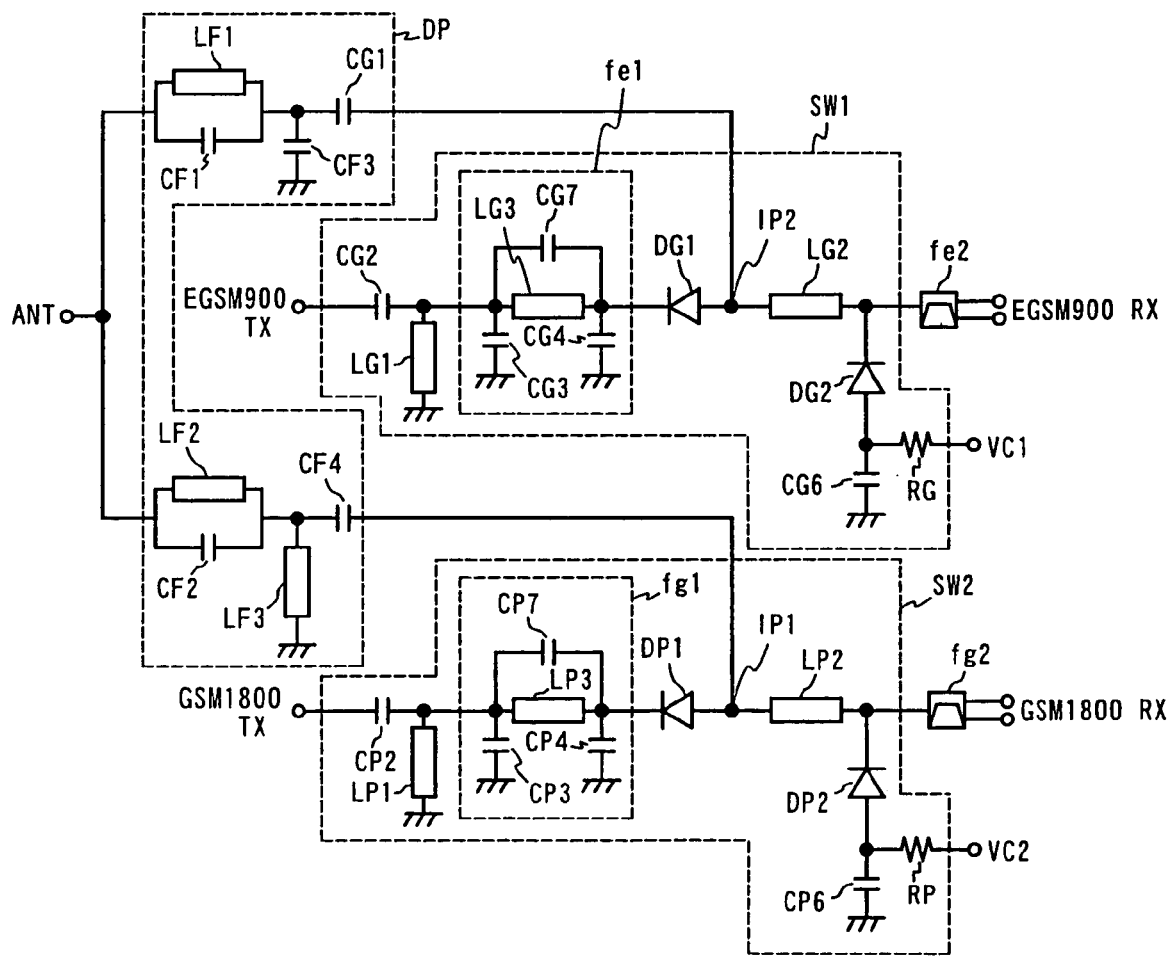
FIG. 17 is a view showing one example of the equivalent circuit of the high-frequency switch module shown in FIG. 16.

This high-frequency switch module comprises a duplexer DP, two high-frequency switches SW1, SW2 for switching a signal line of a reception signal from this duplexer DP to a receiving circuit and a signal line of a transmitting signal from a transmitting circuit to the diplexer DP, low-pass filters fe1, fg1, and SAW filters fe2, fg2 each having the function of a balanced-to-unbalanced transforming circuit of a unbalanced input-balanced output type as an RF interstage filter. The diplexer DP, a plurality of high-frequency switches SW1, SW2 and the SAW filters fe2, fg2 are integrally contained in a laminate constituted by a plurality of dielectric layers, and balanced terminals connected to receiving circuits EGSM900 RX, GSM1800 RX are provided on an outer surface of the laminate. FIG. 17 shows one example of an equivalent circuit of the high-frequency switch module having the circuit shown in FIG. 16.

The diplexer DP is constituted by a plurality of filter circuits, each comprising a transmission line and a capacitor. The diplexer DP comprises a first filter circuit which permits transmitting and receiving signals of EGSM900 to pass through while attenuating transmitting and receiving signals of GSM1800, and a second filter circuit which permits transmitting and receiving signals of GSM1800 to pass through while attenuating transmitting and receiving signals of EGSM900.

In this embodiment, the first filter circuit is a low-pass filter comprising a transmission line LF1 and a capacitor CF1 connected in parallel, with a capacitor CF3 connected between the transmission line LF1 and the capacitor CF1 and a ground. The second filter circuit is a high-pass filter comprising a transmission line LF2 and a capacitor CF2 connected in parallel, with a transmission line LF3 arranged between the transmission line LF2 and the capacitor CF2 and the ground, and a capacitor CF4 series-connected to the transmission line LF2 and the capacitor CF2. By such a structure, received signals of the first transmitting/receiving system EGSM900 and the second transmitting/receiving system GSM1800 can be branched, while a transmitting signal of the first transmitting/receiving system EGSM900 is transmitted to the antenna ANT, and a transmitting signal of the second transmitting/receiving system GSM1800 is also transmitted to the antenna ANT substantially without entering into a transmitting/receiving circuit of the second transmitting/receiving system GSM1800, and substantially without entering into a transmitting/receiving circuit of the first transmitting/receiving system EGSM900. In the present invention, in addition to the above structure, the diplexer DP may be constituted by properly combining a band pass filter, a band elimination filter, a low-pass filter and a high-pass filter such that it functions as described above.

In this embodiment, the transmission line LF3 permits electrostatic discharge coming from the antenna to escape to the ground, thereby preventing the static breakdown of diodes and SAW filters.

Though the transmission lines LF1, LF2, LF3 and the capacitors CF1, CF2, CF3, CF4 in the duplexer DP are contained in the laminate, part thereof may be constituted by a chip inductor and a chip capacitor and mounted on the outer surface of the laminate.

The switch circuits SW1, SW2 are arranged on the downstream of the first and second filter circuits constituting the diplexer DP. The first high-frequency switch SW1 for switching the transmitting circuit EGSM900 TX and the receiving circuit EGSM900 RX, and the second high-frequency switch SW2 for switching the transmitting circuit GSM1800 TX and the receiving circuit GSM1800 RX respectively comprise diodes and transmission lines as main constituents.

The first high-frequency switch SW1 for switching the transmitting circuit EGSM900 TX and the receiving circuit EGSM900 RX comprises two diodes DG1, DG2 and two transmission lines LG1, LG2 as main constituents. The diode DG1 is arranged between an input/output terminal IP2 of transmitting and receiving signals of EGSM900 and EGSM900 TX, with the anode of the diode DG1 connected to the input/output terminal IP2, and a transmission line LG1 connected between the cathode of the diode DG1 and the ground. A transmission line LG2 is connected between the input/output terminal IP2 and EGSM900 RX, one end of the transmission line LG2 (on the side of EGSM900 RX) is connected to the cathode of the diode DG2, a capacitor CG6 is connected between the anode of the diode DG2 and the ground, and a resistor RG is connected between said anode and a control circuit VC1.

Each transmission line LG1 and LG2 has such a line length that its resonance frequency is within a frequency band of a transmitting signal of EGSM900. The low-pass filter fe1 inserted between the first filter circuit and EGSM900 TX is constituted by a transmission line and a capacitor. In the equivalent circuit shown in FIG. 17, a π-type low-pass filter constituted by a transmission line LG3 and capacitors CG3, CG4, CG7 is arranged between the diode DG1 and the transmission line LG1. The low-pass filter fe1 is arranged between elements constituting the high-frequency switch SW1 as a composite structure, though the low-pass filter fe1 may be arranged on the upstream or downstream of the high-frequency switch SW1. The transmission line LG3 and the capacitors CG3, CG4, CG7 are contained in the laminate constituted by a plurality of dielectric layers.

Two diodes DG1, DG2 in the high-frequency switch SW1 are mounted on the outer surface of the laminate. The transmission lines LG1, LG2 and the capacitors CG1, CG2, CG6 are contained in the laminate constituted by a plurality of dielectric layers. The resistor RG connected to the control terminal VC1 may be contained in the laminate, printed on the laminate, or mounted on the laminate as a chip resistor.

The transmission line LG1 and the capacitors CG1, CG2, CG6 may be mounted on the outer surface of the laminate as a chip inductor and chip capacitors, and the capacitor CG2 may be arranged on a circuit board, on which the high-frequency switch module is mounted, as a chip capacitor.

The second high-frequency switch SW2 for switching the receiving circuit GSM1800 RX and the transmitting circuit GSM1800 TX of GSM1800 comprises two diodes DP1, DP2 and two transmission lines LP1, LP2 as main constituents. The diode DP1 is arranged between an input/output terminal IP1 of transmitting and receiving signals of GSM1800 and GSM1800 TX, with the anode of the diode DP1 connected to the input/output terminal IP1, and a transmission line LP1 connected between the cathode of the diode DP1 and the ground. A transmission line LP2 is connected between the input/output terminal IP1 and RX2. The cathode of the diode DP2 is connected to one end of the transmission line LP2 on the RX2 side, and a capacitor CP6 is connected between the anode of the diode DP2 and the ground. A resistor RP is connected between the anode of the diode DP2 and the control circuit VC2.

Each of the transmission line LP1 and the transmission line LP2 has such a line length that its resonance frequency is within a frequency band of a transmitting signal of GSM1800. A low-pass filter fg1 arranged between the second filter circuit and GSM1800 TX is constituted by a transmission line and a capacitor. In the equivalent circuit shown in FIG. 17, a π-type low-pass filter constituted by the transmission line LP3 and the capacitors CP3, CP4, CP7 is arranged between the diode DP1 and the transmission line LP1. The low-pass filter fg1 is arranged between elements constituting the switch circuit 3 as a composite structure, though it may be arranged on the upstream or downstream of the high-frequency switch SW2. The transmission line LP3 and the capacitors CP3, CP4, CP7 are contained in the laminate constituted by a plurality of dielectric layers.

Two diodes DP1, DP2 in the high-frequency switch SW2 are mounted on the outer surface of the laminate. The transmission lines LP1, LP2 and the capacitors CP2, CP6 are contained in the laminate constituted by a plurality of dielectric layers. A resistor RP connected to the control terminal VC2 may be contained in the laminate, printed on the laminate, or mounted on the laminate as a chip resistor.

The transmission line LP1 and the capacitors CP2, CP6 may be mounted on the outer surface of the laminate as a chip inductor and chip capacitors, and the capacitor CP2 may be arranged on a circuit board, on which the high-frequency switch module is mounted, as a chip capacitor.

SAW filters fe2, fg2 arranged on the downstream of the high-frequency switch circuits SW1, SW2 having a function to remove unnecessary frequency components, harmonics, other than the received signals of EGSM900 and GSM1800 are arranged on the laminate. Usable as the SAW filters fe2, fg2 are surface-mounted SAW filters comprising surface acoustic wave elements sealed in a ceramic package. Alternatively, the surface acoustic wave elements may be bonded in a bare state in a cavity provided on the laminate. The SAW filters fe2, fg2 are SAW filters with unbalanced input and balanced output, and by selecting such SAW filter having a balanced-to-unbalanced transformation function in accordance with the input and output impedance of LNA, etc., so that it can function as a balanced-to-unbalanced transforming circuit, it is possible to constitute a 6750-size, small, high-performance, high-frequency switch module having balanced output terminals of EGSM900 and a receiving signal of GSM1800.

When a transmission signal of the EGSM900 system is transmitted in the high-frequency switch module of the present invention, a positive control voltage is applied to the voltage terminal VC1, while a control voltage of 0 V is applied to the voltage terminal VC2. A positive voltage applied from the voltage terminal VC1 is deprived of a DC component by the capacitors CG1, CG2, CG3, CG4, CG6, CG7 and the SAW filter fe2, and turns on the diode DG1 and the diode DG2. Because of its electrode structure, the SAW filter fe2 prevents a DC current from flowing. When the diode DG1 is in an ON state, there is low impedance between the transmitting circuit EGSM900 TX and the diplexer DP. On the other hand, the diode DG2 and the capacitor CG6 in an ON state turn the transmission line LG2 grounded in a high frequency to cause resonance, resulting in extremely large impedance when the receiving circuit EGSM900 RX is viewed form the input/output terminal IP2. As a result, a transmitting signal of the EGSM900 system is transmitted to the receiving circuit EGSM900 RX without leak to the diplexer DP, and then emitted from the antenna ANT. Also, the diodes DP1 and DP2 are in an OFF state by a voltage of 0 V applied from the voltage terminal VC2. Because the diode DP1 in an OFF state has high impedance, a leaked signal from the transmitting circuit GSM1800 TX is shut off and thus not emitted from the antenna ANT.

When a receiving signal of EGSM900 is received, a voltage of 0 V is applied to the voltage terminals VC1 and VC2. As a result, the diodes DG1 and DG2 are turned off. The diodes DP1 and DP2 are also turned off. With the diode DG1 in an OFF state, there is high impedance between the transmitting circuit EGSM900 TX and the diplexer DP, resulting in no connection therebetween. In addition, with the diode DG2 in an OFF state, the diplexer DP and the receiving circuit EGSM900 RX are connected via the transmission line LG2 and the SAW filter fe2, resulting in the balanced output of the received signal.

When the transmitting signal of the GSM1800 system is transmitted, a voltage of 0 V is applied to the voltage terminal VC1, while a positive voltage is applied to the voltage terminal VC2. The positive voltage applied from voltage terminal VC2 is deprived of a DC component by the capacitors CP2, CP3, CP4, CP6, CP7 and the SAW filter fg2, so that the diodes DP1 and DP2 are turned on. Because of its electrode structure, the SAW filter does not permit a DC current to flow. With the diode DP1 in an ON state, there is low impedance between the transmitting circuit GSM1800 TX and the diplexer DP. On the other hand, the diode DP2 and the capacitor CP6 in an ON state turn the transmission line LP2 grounded in a high frequency to cause resonance, resulting in extremely large impedance when the receiving circuit GSM1800 RX is viewed form the input/output terminal IP1. As a result, the transmitting signal of the GSM1800 system is transmitted to the receiving circuit GSM1800 RX without leak to the duplexer, and then emitted from the antenna. The diodes DG1 and DG2 are turned off by a voltage of 0 V applied from the voltage terminal VC1. Because the diode DG1 in an OFF state has high impedance, a leaked signal from the transmission circuit EGSM900 TX is shut off and thus not emitted from the antenna ANT.

When the receiving signal of the GSM1800 system is received, a voltage of 0 V is applied to the voltage terminals VC1 and VC2, turning off the diodes DP1 and DP2. The diodes DG1 and DG2 are also turned off. With the diode DP1 in an OFF state, there is high impedance between the transmitting circuit GSM1800 TX and the diplexer DP, resulting in no connection therebetween. Also, with the diode DP2 in an OFF state, the diplexer DP is connected to the receiving circuit GSM1800 RX via the transmission line LP2, the SAW filter fg2 and the balanced-to-unbalanced transformer, resulting in balanced output of the received signal.

In this embodiment, the balanced-output reception signal has an amplitude balance of within ±1 dB and a phase balance of within 180±10 deg.

[3] Second Example of Obtaining Balanced Output in High-Frequency Switch Module

As described above, it is preferable to use the SAW filter as a balanced-to-unbalanced transforming circuit if the high-frequency switch module is to be constituted by as small numbers of circuit elements as possible. However, it is not necessarily easy to constitute the high-frequency switch module with desired input and output impedance, while maintaining electric characteristics necessary for filters such as specific bandwidth, insertion loss, etc., and phase balance and amplitude balance necessary for a balanced-to-unbalanced transforming circuit. In such a case, it is preferable to use a balanced-to-unbalanced transformer as a balanced-to-unbalanced transforming circuit in the form of a composite structure contained in the high-frequency switch module.

Figure 18:
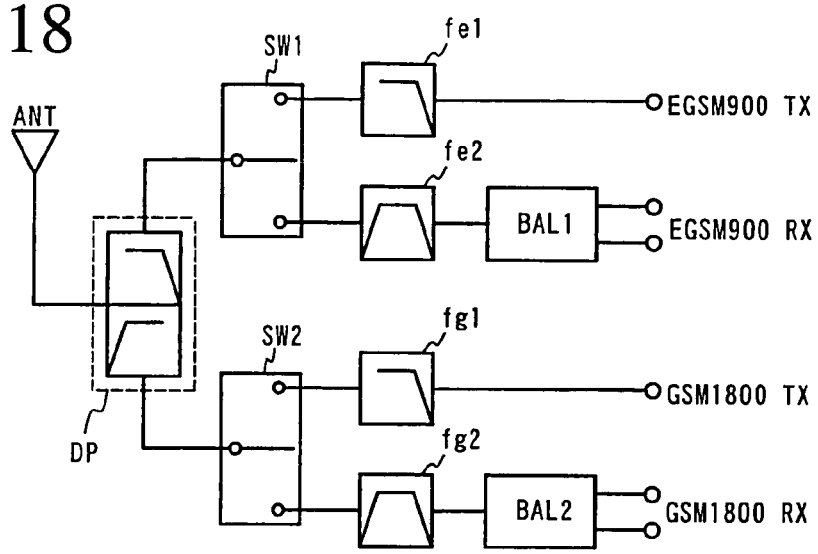
FIG. 18 is a block diagram showing the circuit of the high-frequency switch module according to a further embodiment of the present invention.
Figure 19:
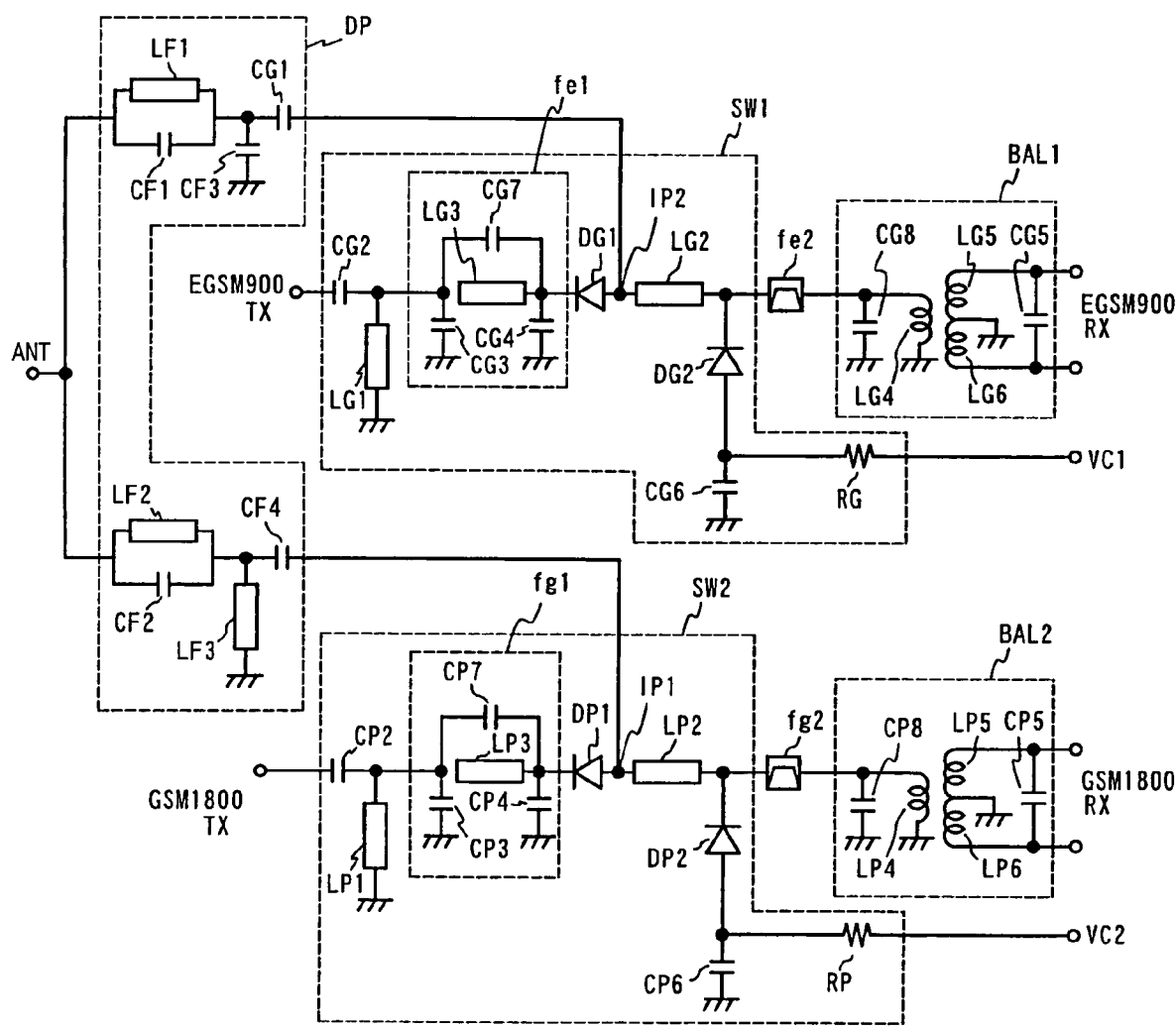
FIG. 19 is a view showing one example of the equivalent circuit of the high-frequency switch module shown in FIG. 18.

FIG. 18 shows the circuit of the high-frequency switch module according to another embodiment of the present invention, and FIG. 19 shows its equivalent circuit. Balanced-to-unbalanced transformers BAL1, BAL2 having the functions of balanced-to-unbalanced transformation and impedance transformation are arranged on the downstream of the unbalanced-to-unbalanced SAW filters fe2, fg2. The balanced-to-unbalanced transformer BAL1 is constituted by transmission lines LG4, LG5, LG6, and the balanced-to-unbalanced transformer BAL2 is constituted by transmission lines LP4, LP5, LP6. These transmission line are contained in the laminate constituted by a plurality of dielectric layers.

Figure 20:
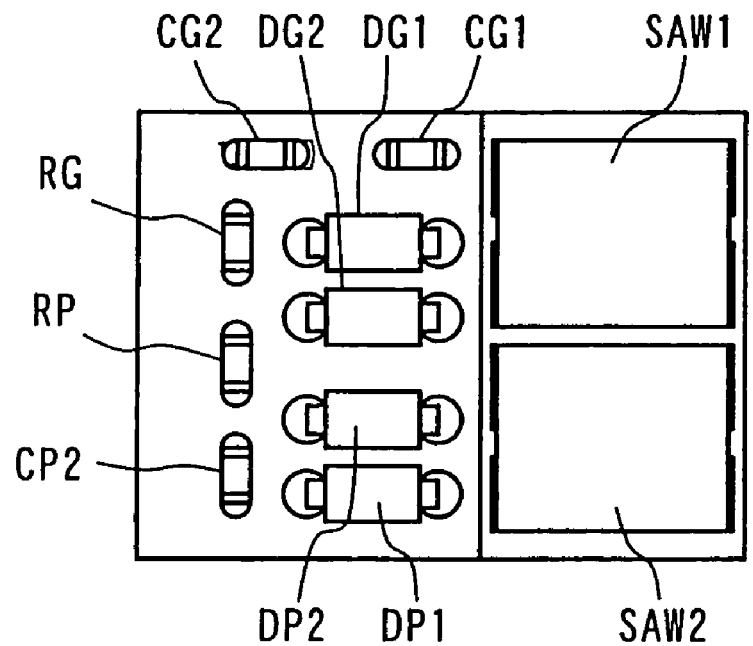
FIG. 20 is a plan view showing the high-frequency switch module according to one embodiment of the present invention.
Figure 21:
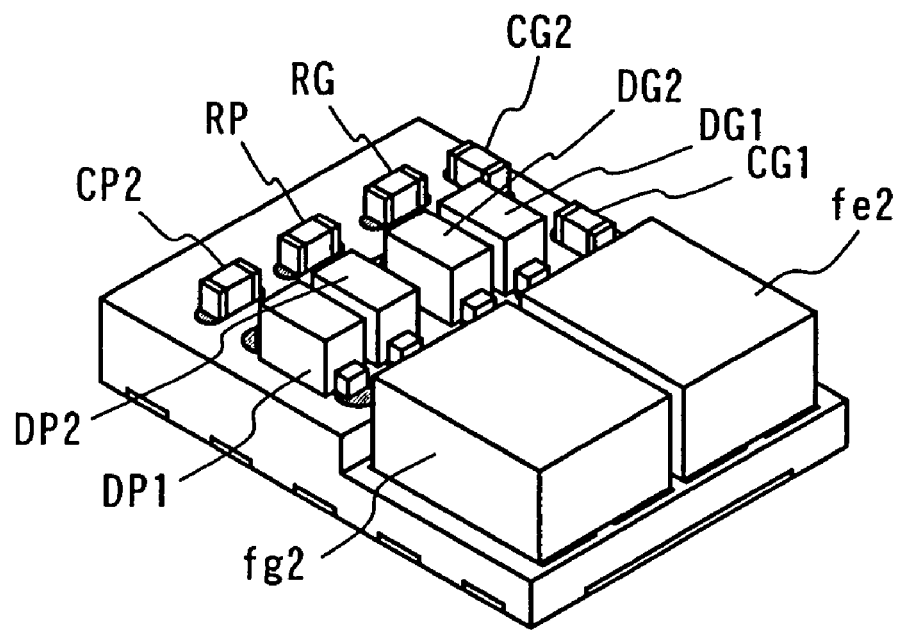
FIG. 21 is a perspective view showing the high-frequency switch module according to one embodiment of the present invention.
Figure 22:
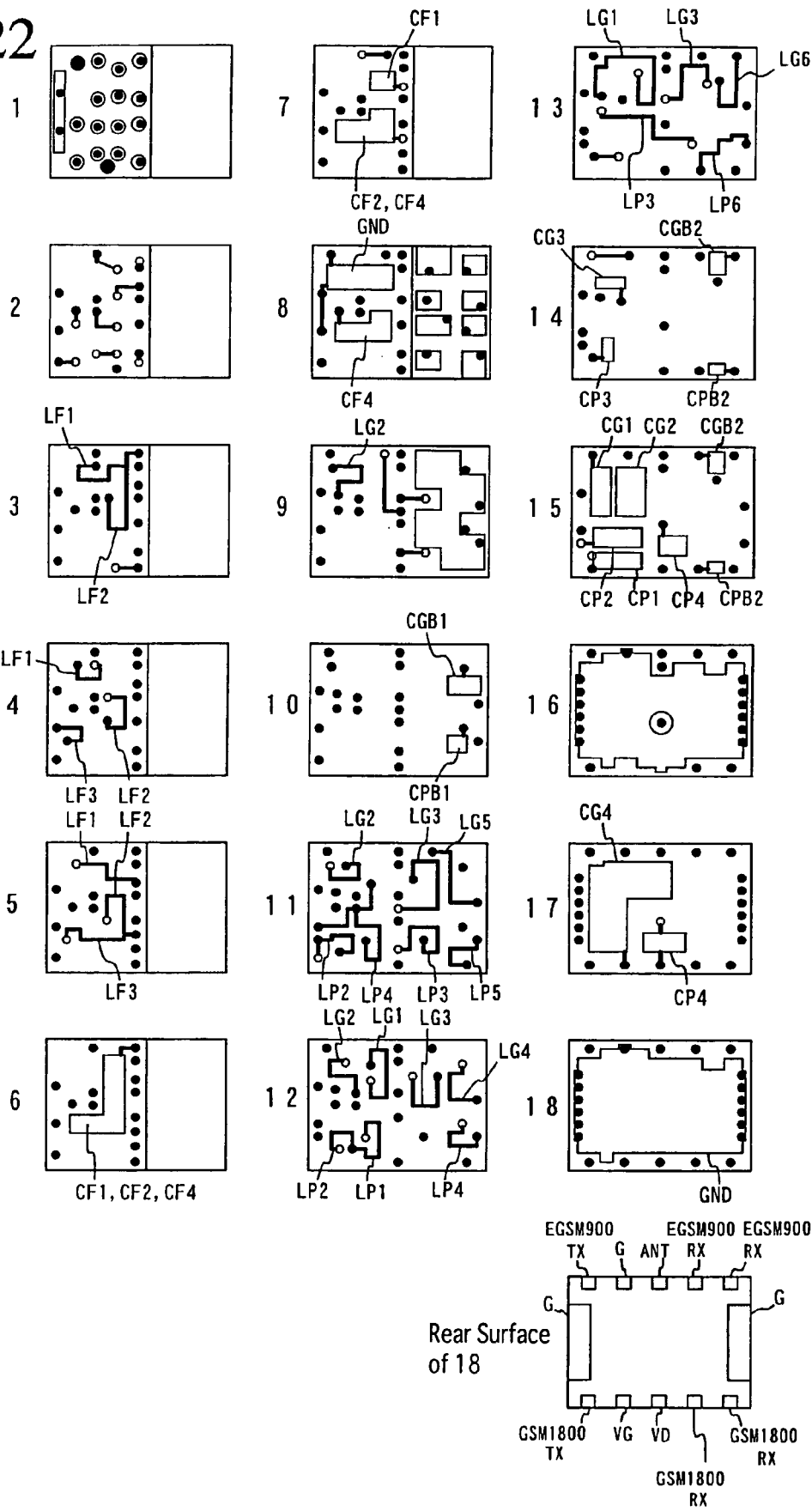
FIG. 22 is a view showing an electrode pattern in each layer of the laminate constituting the high-frequency switch module having the equivalent circuit of FIG. 19.

FIG. 20 is a plan view showing such a high-frequency switch module, FIG. 21 is its perspective view, and FIG. 22 shows the internal structure of its laminate. In this embodiment, transmission lines for the first and second filter circuits constituting a duplexer DP, low-pass filters fe1, fg1 and high-frequency switches SW1, SW2, and transmission lines for the balanced-to-unbalanced transformers BAL1, BAL2 are constituted as strip lines in the laminate. Diodes, SAW filters, high-capacitance capacitors and resistors are mounted on the laminate as chip capacitors and chip resistors. As a result, a 6750-size, one-chip, high-frequency switch module is constituted.

The internal structure of this laminate will be explained referring to FIG. 22. This laminate is constituted by printing an Ag-based conductive paste to each green sheet made of a low-temperature co-fireable dielectric ceramic material and having a thickness of 30-200 μm to form a desired electrode pattern, properly laminating the green sheets, and integrally sintering the resultant laminate. Each line electrode has a width of 100-400 μm. The electrode patterns comprise line electrodes for constituting ground electrodes GND and transmission lines, capacitor electrodes for constituting capacitors, and connection lines circuit for electrically connecting elements (electrodes for connecting circuit elements). The electrode patterns arranged on the laminate are, properly connected through via-holes (shown by black circles in the figures) and said connecting electrodes, constituting transmission lines and capacitors for the first and second switch circuits SW1, SW2, transmission lines and capacitors for the diplexer, and transmission lines and capacitors for the balanced-to-unbalanced transformers. The ground terminals of the SAW filters are electrically connected to ground electrodes formed in the laminate via connecting means such as via-holes, external electrodes, etc., and the balanced-to-unbalanced transformers share the ground electrodes with the switch circuits and the diplexer.

Capacitors CG8, CP8 connected to the ground are arranged on the input side of the balanced-to-unbalanced transformer, and capacitors CG5, CP5 are arranged between the balanced terminals. When transmission lines for the balanced-to-unbalanced transformer are contained in the laminate having a limited area, it is likely that transmission lines with necessary length cannot be formed, resulting in difficulty in obtaining a desired turns ratio, and making the transmission lines LG5, LG6 and the transmission lines LP5, LP6 symmetric on the balance side. In such a case, necessary input and output impedance and phase and amplitude balance cannot be obtained, needing the addition of capacitors for adjusting them. The capacitors may be contained in the laminate, or mounted on the laminate as chip capacitors. The balanced-to-unbalanced transformer may share a ground with other circuit parts.

In this embodiment, the diodes DG1, DG2, DP1, DP2, the chip capacitors CG1, CG2, CP2, the chip resistors RQ, RP, and the surface-mounting SAW filters fe2, fg2 are mounted on the laminate. When the balanced-to-unbalanced transformer is integrated as a balanced-to-unbalanced transforming circuit with other circuits in the laminate, excellent insertion loss and isolation characteristics can be obtained in each transmitting/receiving system, and it is possible to obtain a small, high-performance, high-frequency switch module comprising balanced output terminals which are to be connected to balanced-input-type, high-frequency parts (LNA). In this case, too, a balanced-output receiving signal has an amplitude balance of within ±1 dB and a phase balance of within 180±10 deg.

Figure 23A:
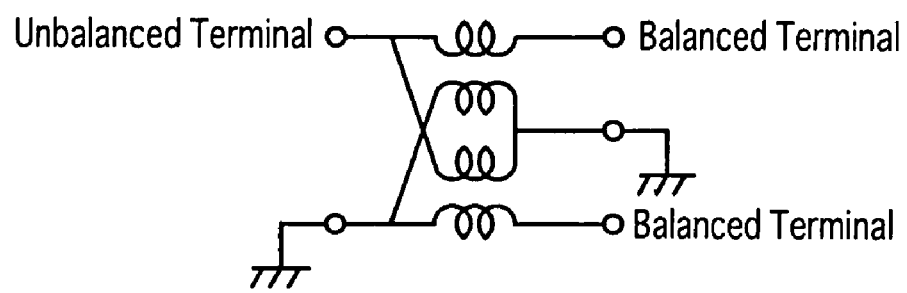
FIG. 23(a) is a view showing an equivalent circuit in another example of the balanced-to-unbalanced transformer used in the high-frequency switch module of the present invention.
Figure 23B:
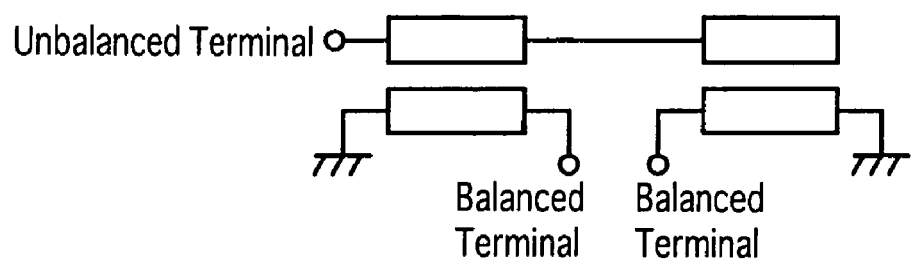
FIG. 23(b) is a view showing an equivalent circuit in a further example of the balanced-to-unbalanced transformer used in the high-frequency switch module of the present invention.

The balanced-to-unbalanced transformer may have various structures in addition to the trifiler type shown in FIG. 19, and other examples of the equivalent circuit of the balanced-to-unbalanced transformer are shown in FIGS. 23(a) and (b).

Figure 24:
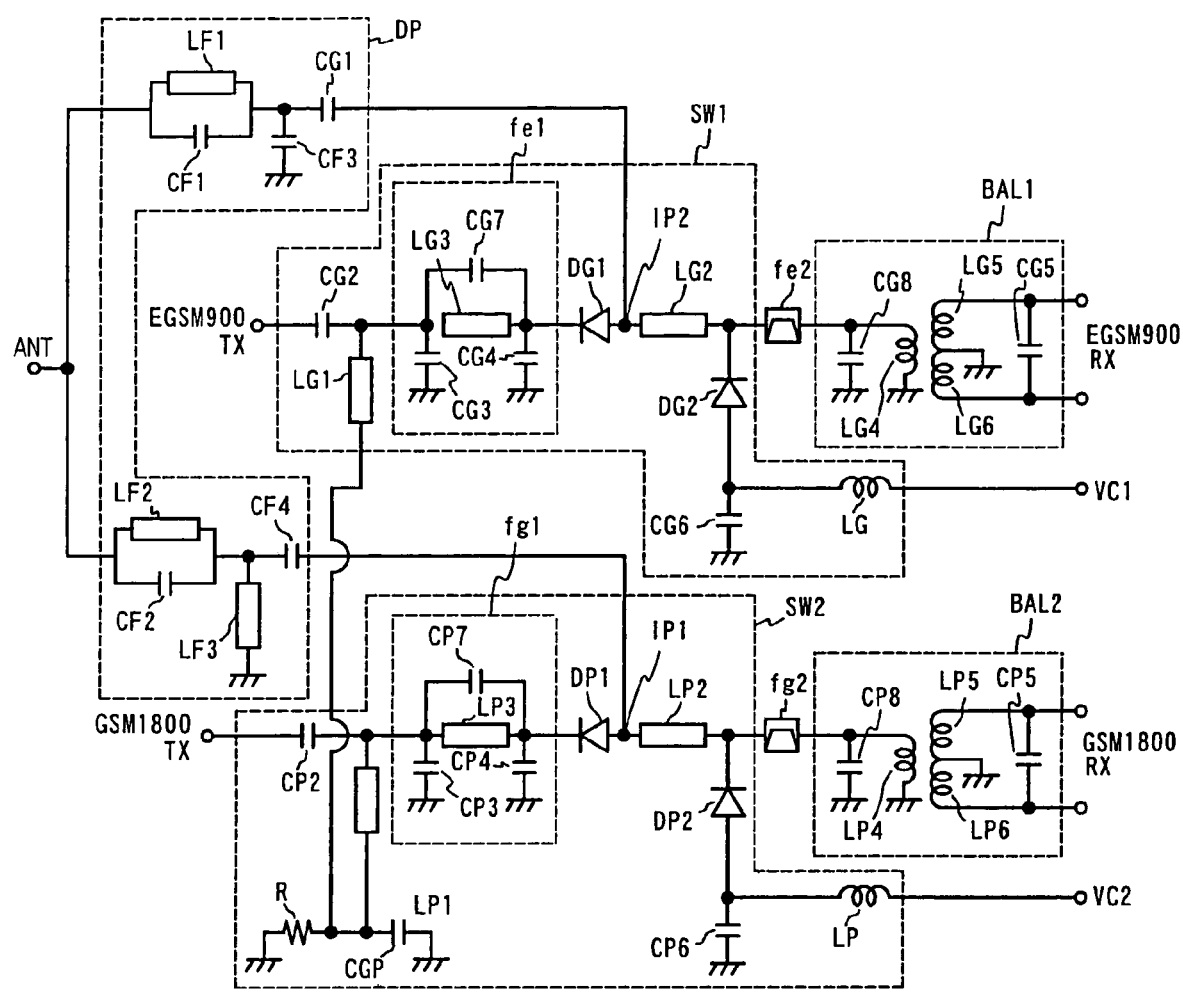
FIG. 24 is a view showing another example of the equivalent circuit of the high-frequency switch module shown in FIG. 16.

In FIG. 19, for instance, when a positive voltage is given to the voltage terminal VC1 in an EGSM900 TX mode, the diodes DP1, DP2 in the high-frequency switch SW2 connected to the transmitting/receiving system of GSM1800 are free from bias. If a transmitting signal of EGSM900 TX entering into the high-frequency switch SW2 for some reason reaches the diode DP1, non-linear operation is likely to occur because the diode DP1 is in an unstable potential state, resulting in the generation of harmonics. The high-frequency switch module shown in FIG. 24 completely prevents the generation of such harmonics. Specifically, in the high-frequency switches SW1, SW2 having the structures shown in FIG. 24, voltage generated by the resistor R is applied to the diode DP1 having a polarity opposite thereto, so that the diode DP1 is reversely biased to a stable potential state, thereby preventing the generation of harmonics.

[4] Third Example of Obtaining Balanced Output in High-Frequency Switch Module

Figure 25:
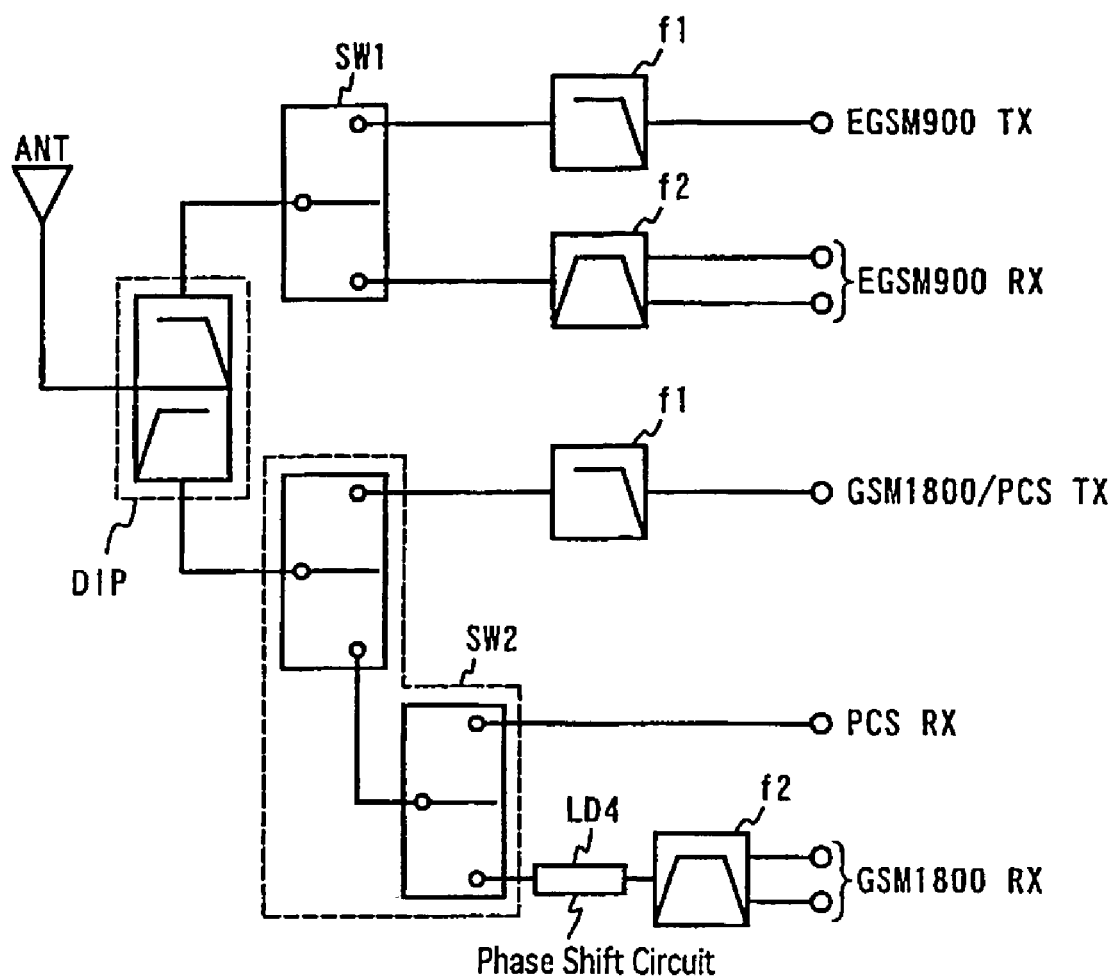
FIG. 25 is a block diagram showing the circuit of the high-frequency switch module according to a further embodiment of the present invention.

FIG. 25 shows the circuit of the high-frequency switch module in this embodiment. This high-frequency switch module, which handles three different communications systems by a single multi-connection system, comprises a first high-frequency switch SW1 for switching a transmitting circuit and a receiving circuit of a first transmitting/receiving system (for instance, EGSM900 with a transmitting frequency of 880-915 MHz and a receiving frequency of 925-960 MHz), and a second high-frequency switch SW2 for switching transmitting circuits of second and third transmitting/receiving systems, a receiving circuit of a second transmitting/receiving system (GSM1800 with a transmitting frequency of 1710-1785 MHz and a receiving frequency of 1805-1880 MHz), and a receiving circuit of a third transmitting/receiving system (PCS with a transmitting frequency of 1850-1910 MHz and a receiving frequency of 1930-1990 MHz). The second transmitting/receiving system and the third transmitting/receiving system share a transmitting circuit, and a phase shift circuit LD4 is arranged between the high-frequency switch SW2 and the SAW filter f2. The SAW filter f2 is in an unbalanced input, balanced output type with a balanced output terminal connected to an inductor. Incidentally, because the high-frequency switches SW1, SW2 may be the same as those previously proposed by the inventors (.O 00/55983), their explanation is omitted here.

Figure 26:
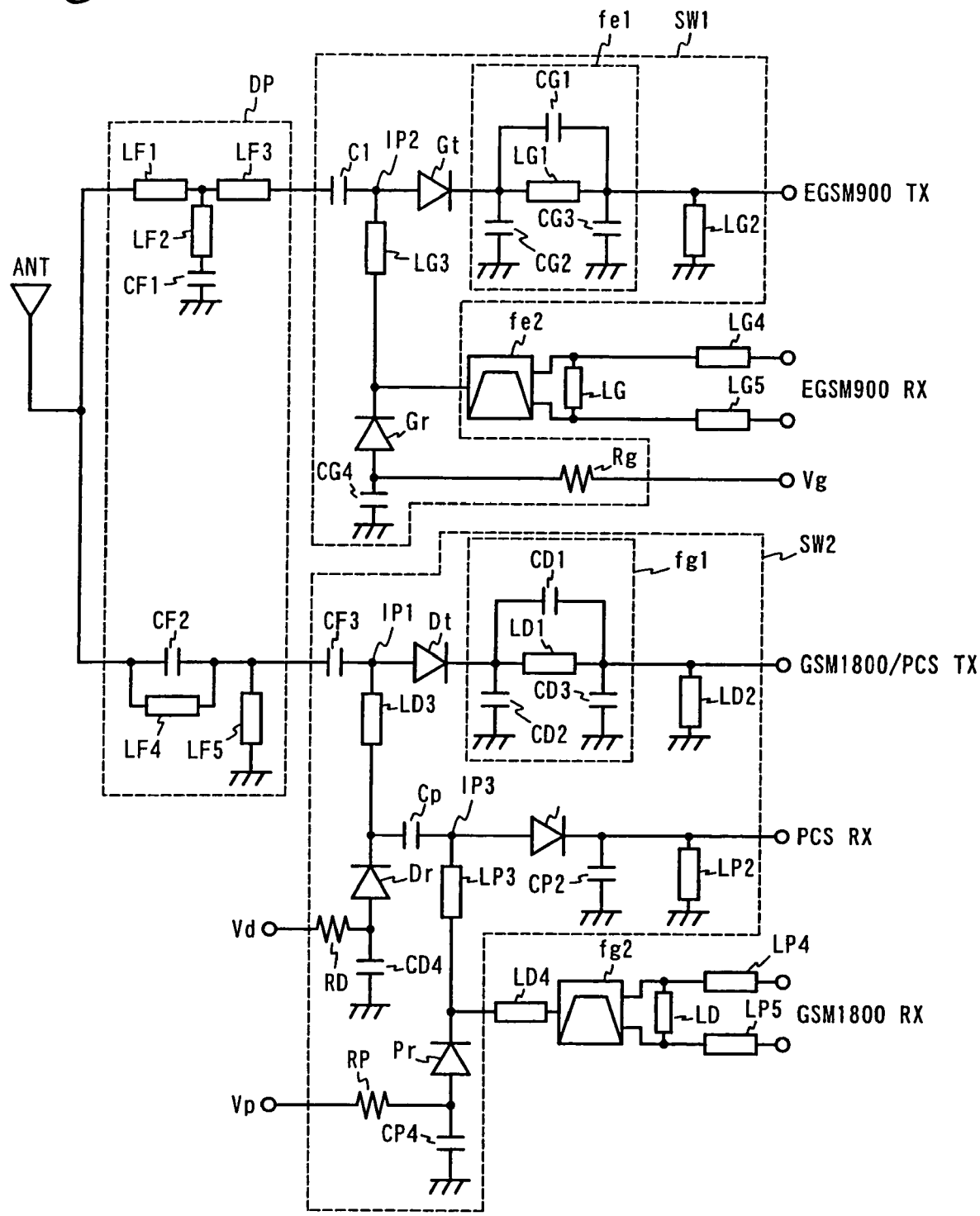
FIG. 26 is a block diagram showing one example of the equivalent circuit of the high-frequency switch module shown in FIG. 25.
Figure 27:
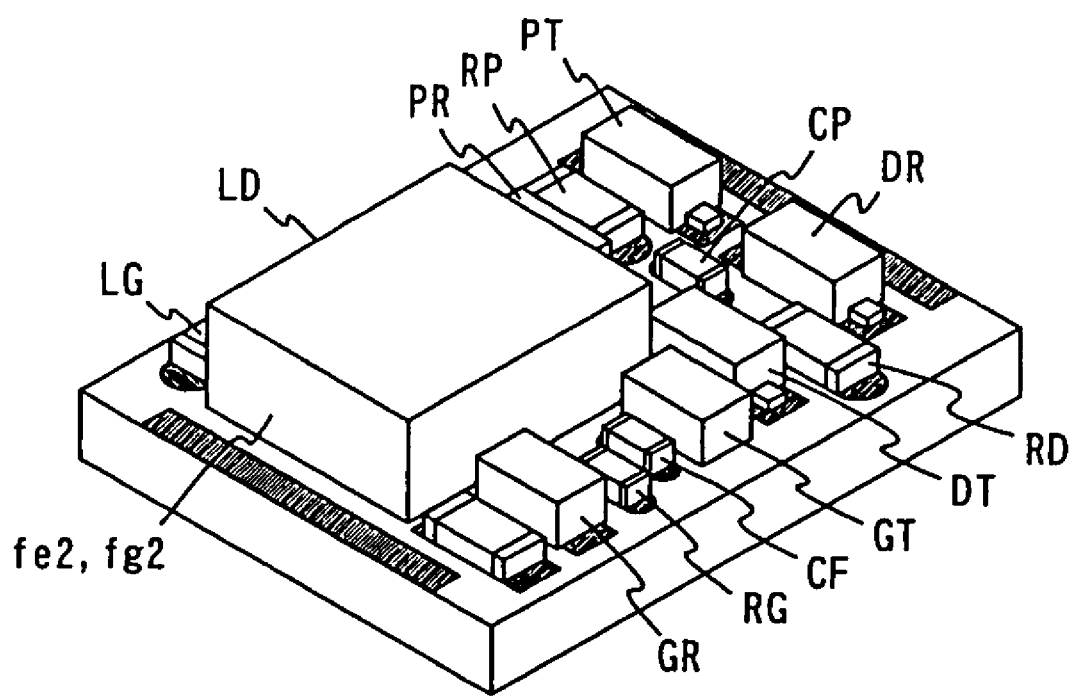
FIG. 27 is a perspective view showing the high-frequency switch module according to another embodiment of the present invention.
Figure 28:
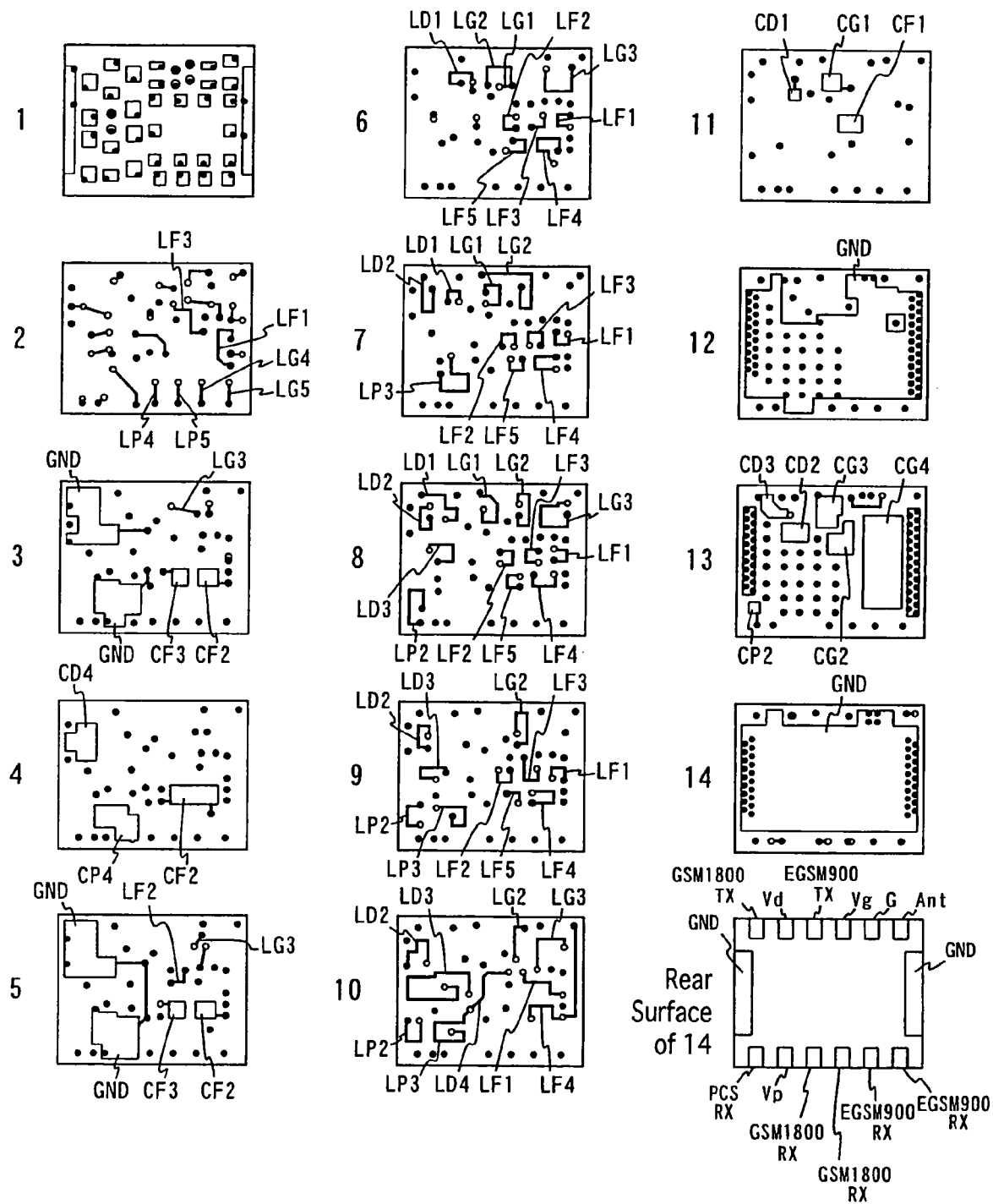
FIG. 28 is a view showing an electrode pattern in each layer of the laminate constituting the high-frequency switch module having the equivalent circuit shown FIG. 26.
Figure 29A:
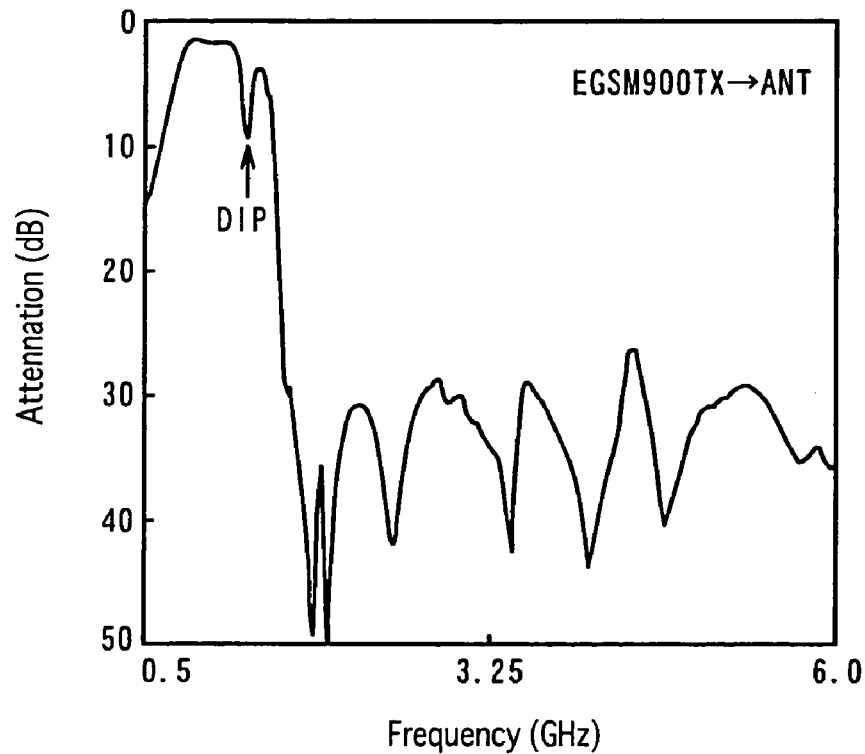
FIG. 29(a) is a graph showing attenuation characteristics between EGSM900 TX and the antenna ANT in the high-frequency switch module of the present invention.
Figure 29B:
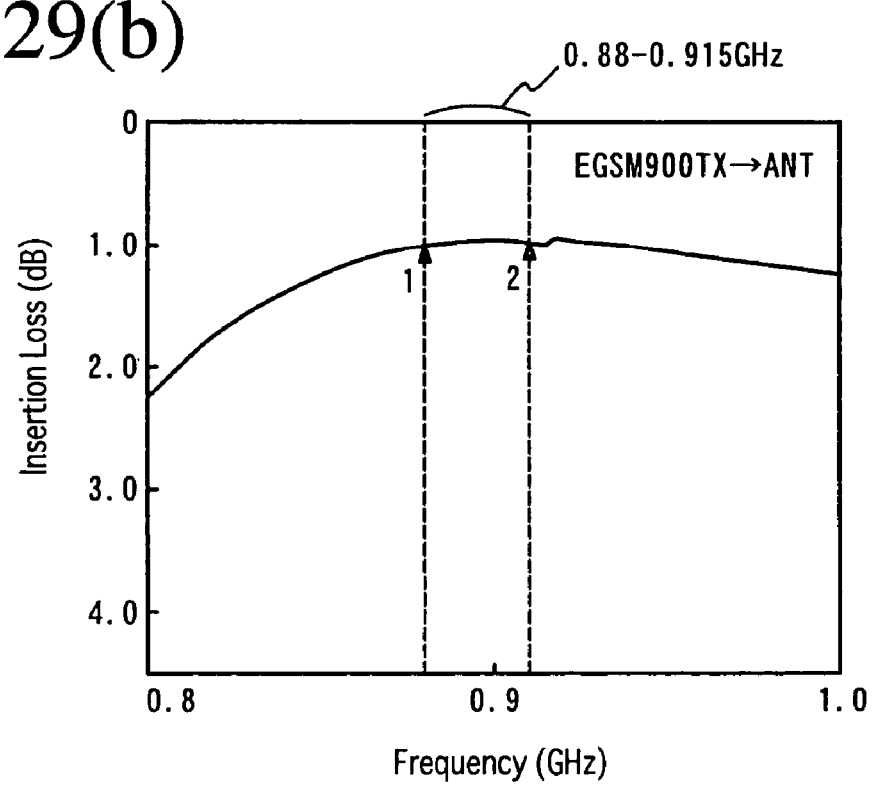
FIG. 29(b) is a graph showing insertion loss characteristics between EGSM900 TX and the antenna ANT in the high-frequency switch module of the present invention.
Figure 30A:
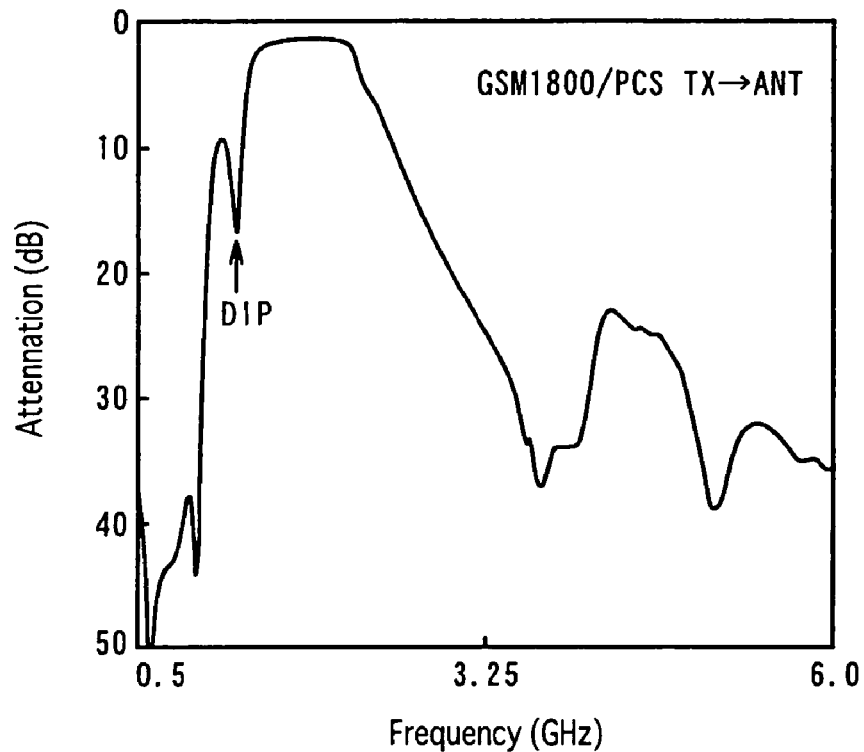
FIG. 30(a) is a graph showing attenuation characteristics between GSM1800/PCS TX and the antenna ANT in the high-frequency switch module of the present invention.
Figure 30B:
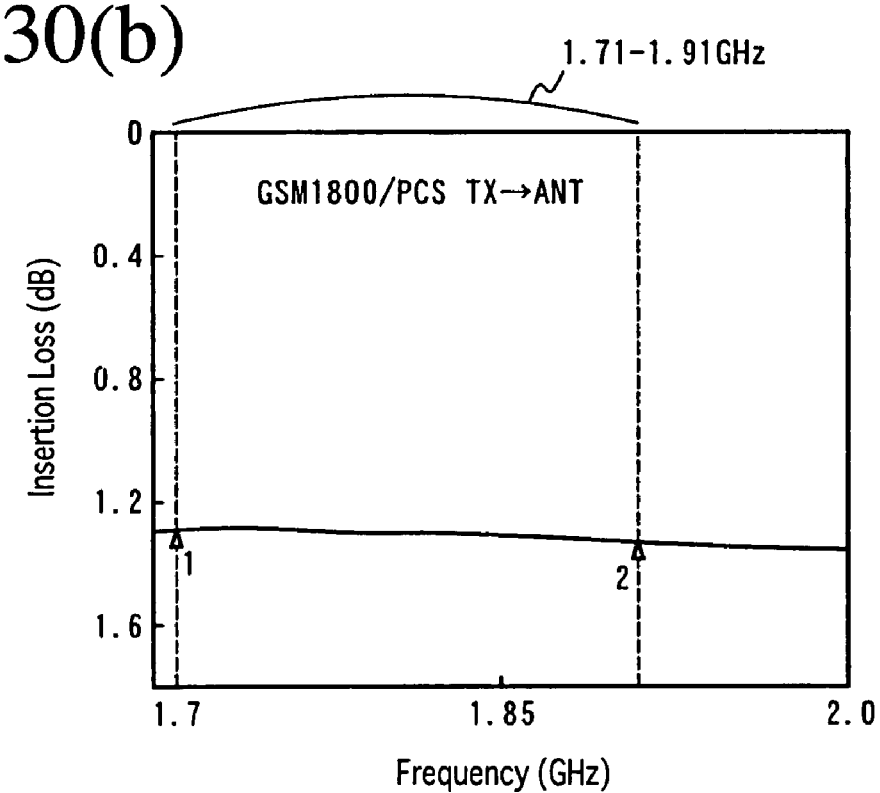
FIG. 30(b) is a graph showing insertion loss characteristics between GSM1800/PCS TX and the antenna ANT in the high-frequency switch module of the present invention.
Figure 31A:
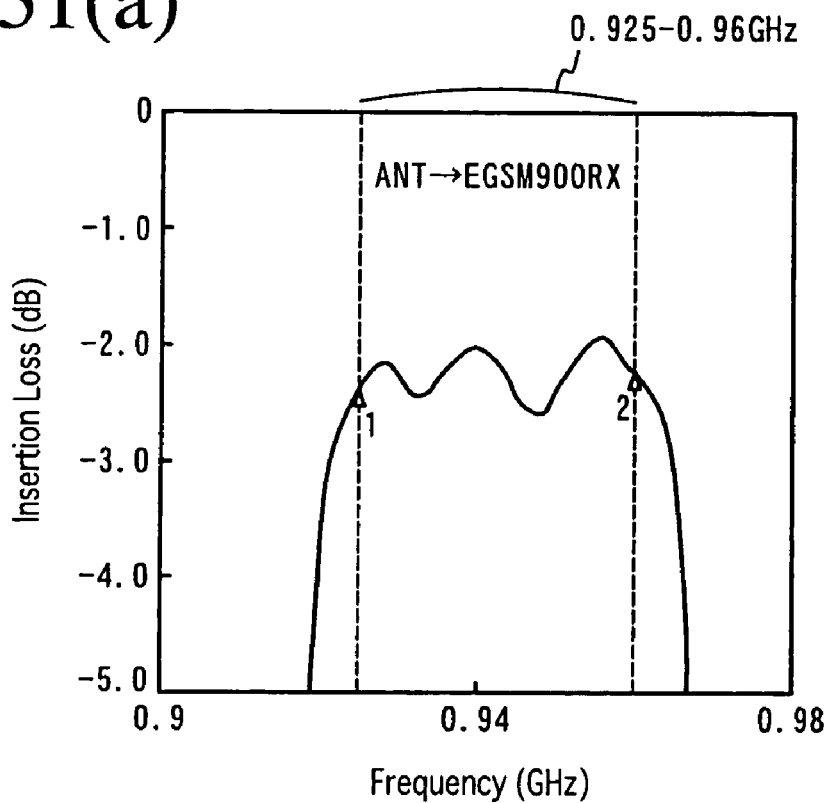
FIG. 31(a) is a graph showing insertion loss characteristics between the antenna ANT and EGSM900 RX in the high-frequency switch module of the present invention.
Figure 31B:
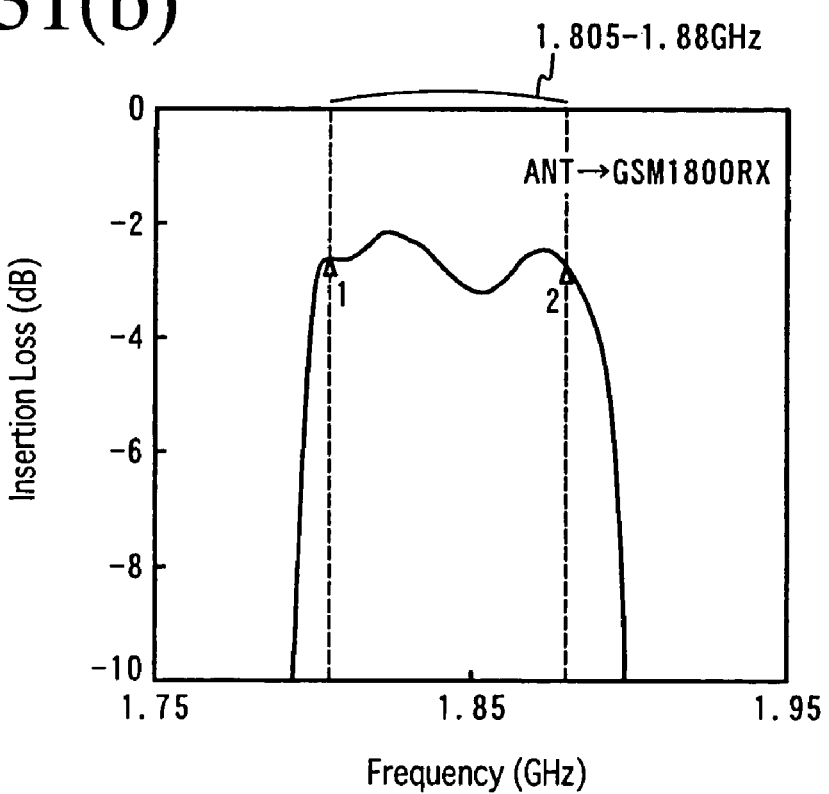
FIG. 31(b) is a graph showing insertion loss characteristics between the antenna ANT and GSM1800 RX in the high-frequency switch module of the present invention.
Figure 32A:
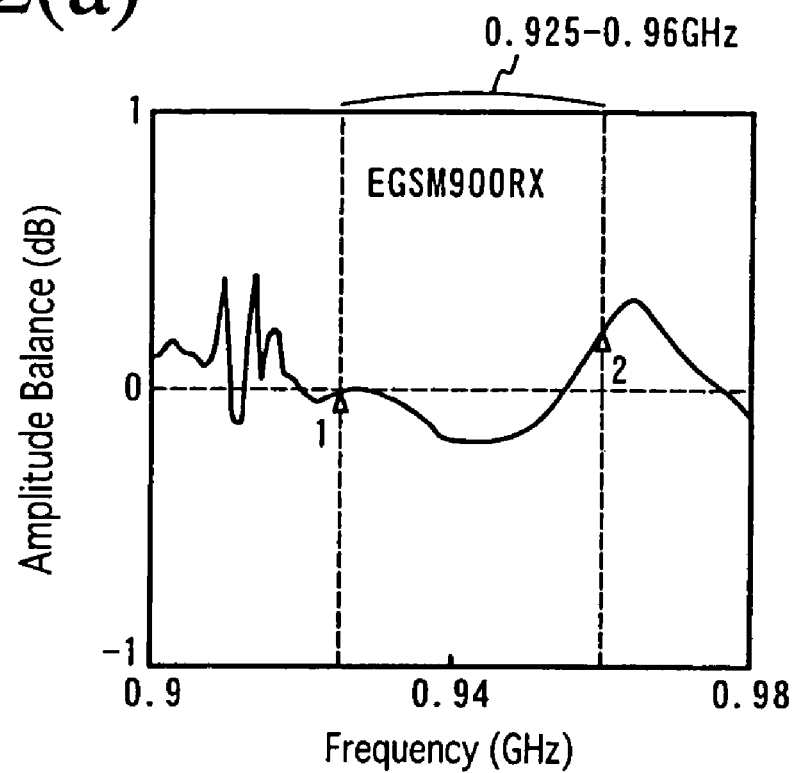
FIG. 32(a) is a graph showing the relation between the amplitude balance of EGSM900 RX and frequency in the high-frequency switch module of the present invention.
Figure 32B:
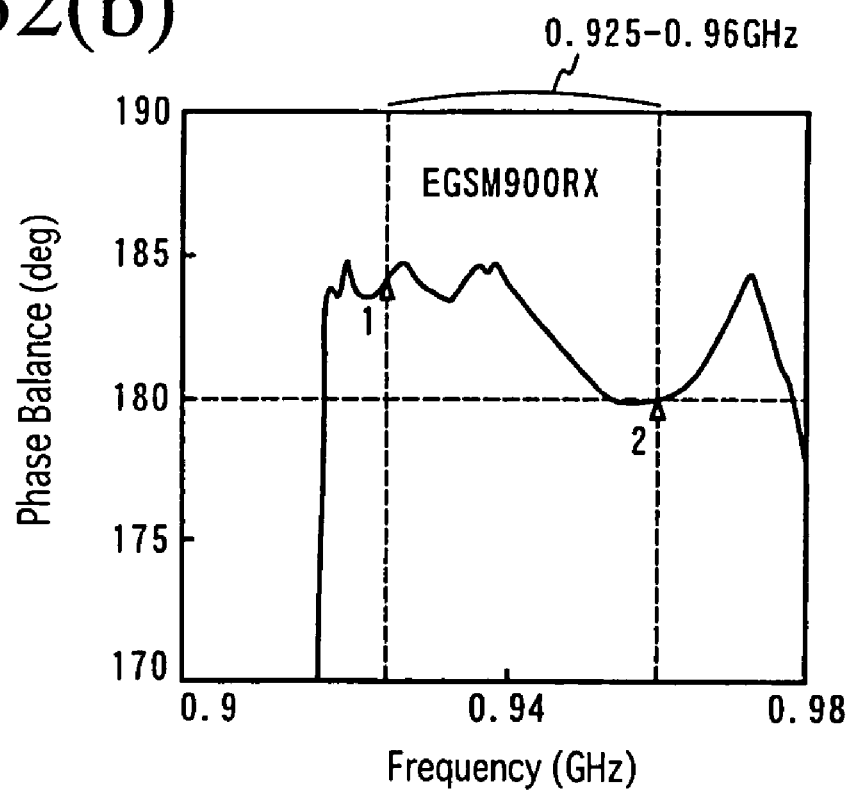
FIG. 32(b) is a graph showing the relation between the phase balance of EGSM900 RX and frequency in the high-frequency switch module of the present invention.
Figure 33A:
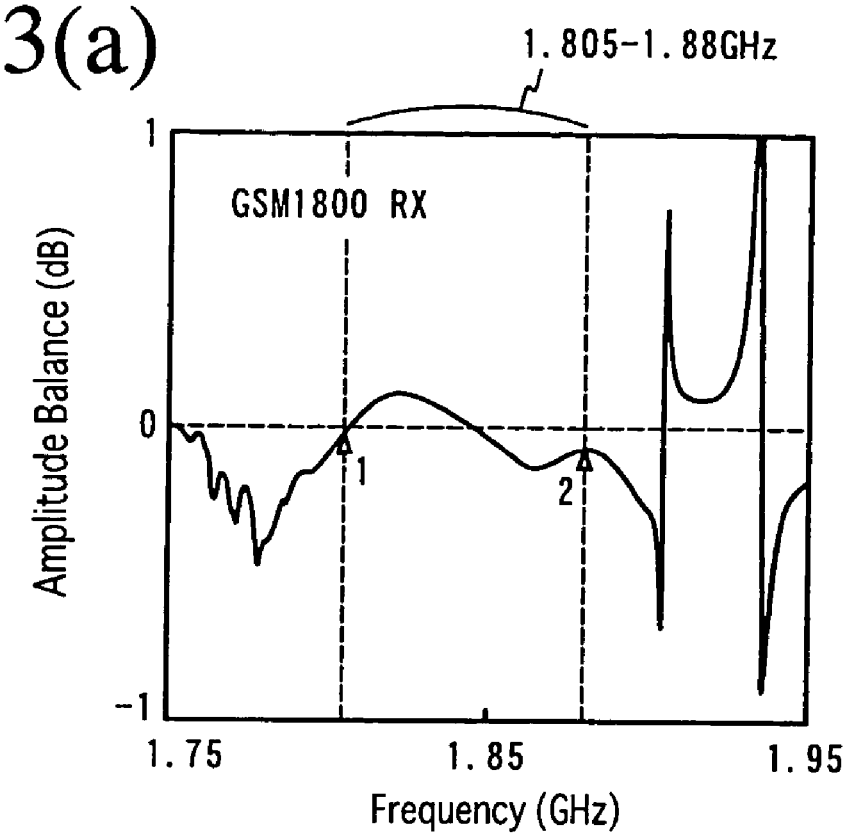
FIG. 33(a) is a graph showing the relation between the amplitude balance of GSM1800 RX and frequency in the high-frequency switch module of the present invention.
Figure 33B:
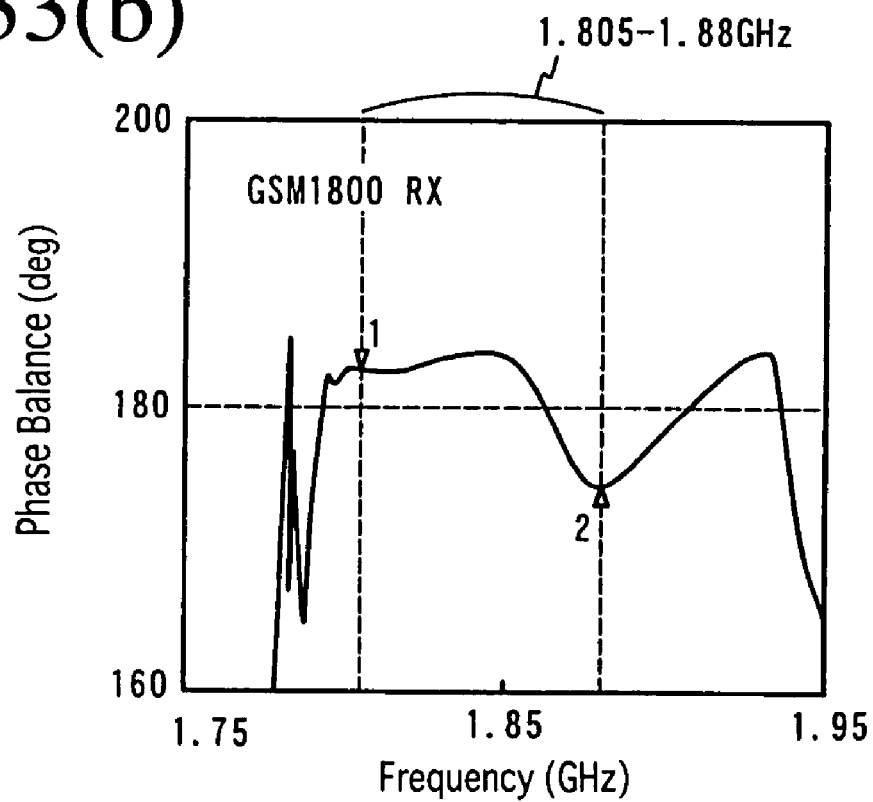
FIG. 33(b) is a graph showing the relation between the phase balance of GSM1800 RX and frequency in the high-frequency switch module of the present invention.

FIG. 26 shows the equivalent circuit of the high-frequency switch module shown in FIG. 25, FIG. 27 shows the external appearance of the high-frequency switch module, and FIG. 28 shows the internal structure of the laminate. The SAW filter fg2 is connected to the high-frequency switch via the phase shift circuit LD4 constituted by transmission lines. Inductors LG, LD are connected in parallel between the balanced output terminals of the SAW filters fe2, fg2.

The inductance of the inductors LG, LD is properly selected depending on a frequency used, and recommendation is, for instance, about 10-30 nH for GSM1800, and about 30-60 nH for EGSM900 in a 800-MHz band. In this embodiment, because the inductors LG, LD are mounted on the laminate as chip inductors, inductance can be finely adjusted by changing the chip inductors. The inductor may be formed in the laminate in a transmission line pattern in a meandering, coil-like or spiral shape, etc. The formation of at least part of said pattern on the laminate is preferable, because inductance can be finely adjusted by trimming, because an area in which the inductor is mounted can be reduced, and because the high-frequency switch module can be made smaller.

Though the SAW filters fe2, fg2 are pipe-sealing SAW filters here, the use of a composite-type SAW filter comprising a plurality of transmitting/receiving systems in one package, for instance, two filters for EGSM900 and GSM1800, is advantageous in reducing a mounting area in the laminate by about 30% as compared with a case where two single SAW filters are used.

When surface acoustic wave elements constituting the SAW filter are used in the form of bare chips of a ball grid array (BGA) or a land grid array (LGA), and arranged in cavities provided in the laminate for bump connection with transmission lines, etc. in the laminate, lead wires for wire bonding in the pipe sealing-type SAW filters and a molding resin can make parasitic inductance and capacitance component extremely smaller. Also, their face-down mounting keeps a main surface of the laminate flat, making it easy to handle them by a mounter, etc. Their sealing may be carried out by a gas-tight sealing method using a sealing metal or a resin-sealing method.

According to this embodiment, as is clear from the frequency characteristics shown in FIGS. 29-33, the in-band ripple of the SAW filter can be made 2.0 dB or less, thereby preventing the quality deterioration of a reception signal. By properly adjusting the line lengths of transmission lines LG4, LG5, LP4, LP5 arranged between the balanced output terminals of the SAW filter and the external terminals of the high-frequency switch module that are connected to a board on which the high-frequency switch module is mounted, the balanced-output reception signal has an amplitude balance of within ±1 dB and a phase balance of within 180°±10°, thereby providing as small a high-frequency switch module as 6750 size.

Figure 34:
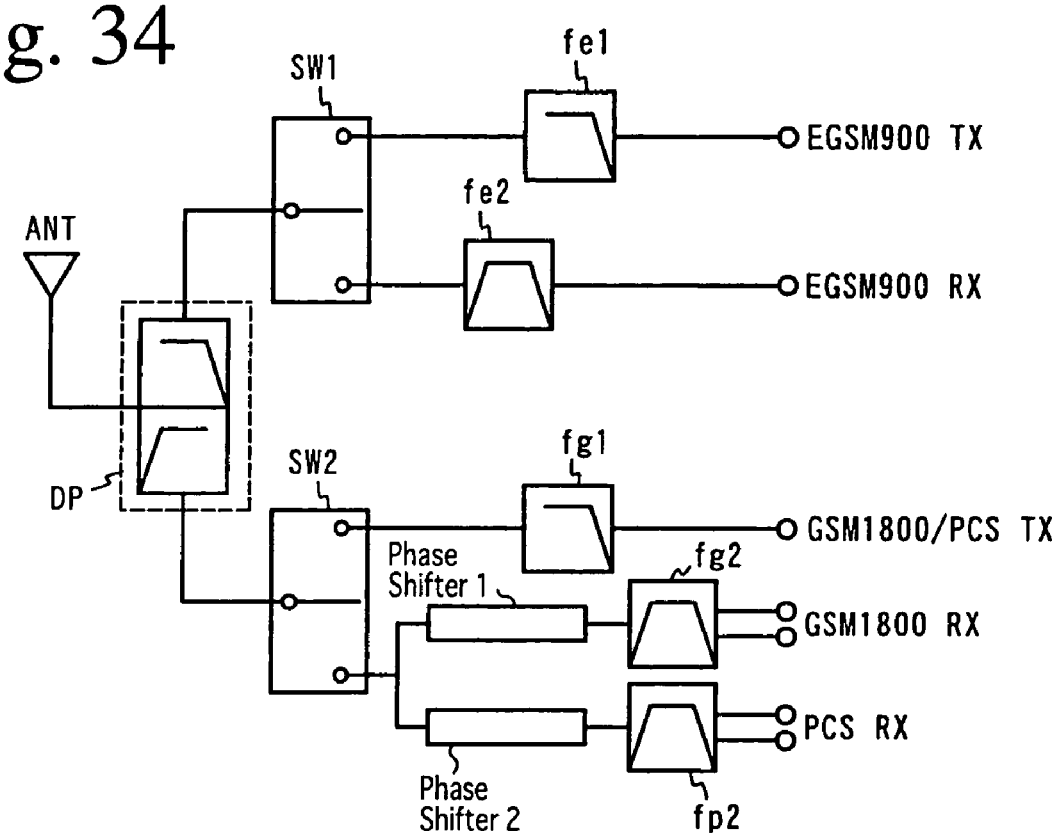
FIG. 34 is a block diagram showing the circuit of the high-frequency switch module according to a further embodiment of the present invention.

Though the present invention has specifically been explained according to the above embodiments, the present invention is not restricted thereto, and it is applicable to a high-frequency switch module as shown in FIG. 34, and a high-frequency switch module comprising a SAW duplexer comprising a combination of a phase shifter and a SAW filter, if necessary. In addition, at least one of PA (power amplifier), LNA (low-noise amplifier), a mixer and an isolator may be added. It should thus be understood that the present invention is applicable to high-frequency switch circuits of various structures within its concept.

APPLICABILITY IN INDUSTRY

Because the high-frequency switch module of the present invention comprising high-frequency switches and other high-frequency parts such as SAW filters, etc. as an integral composite structure is excellent in electric characteristics while it is small, it is usable for mobile communications such as single-band mobile phones, multi-band mobile phones, etc. Because the inclusion of balanced-to-unbalanced transforming circuits (or balanced-to-unbalanced transforming circuits and impedance-converting circuits) makes it possible to reduce the number of accessory parts for impedance matching such as capacitors, inductors, etc. in RF circuits of mobile communications equipment such as mobile phones, etc., it can make the circuits smaller and increase the flexibility of circuit arrangements. As a result, the mobile communications comprising such high-frequency switch modules can be made smaller and lighter in weight.

What is claimed is:

1. A high-frequency switch module, comprising:
   a laminate comprising a plurality of dielectric layers each having an electrode pattern, said high-frequency switch module comprising a high-frequency switch circuit for switching a transmitting circuit and a receiving circuit of transmitting/receiving systems; and
   a filter circuit connected to a receiving side of said high-frequency switch circuit,
   wherein said filter circuit is a surface acoustic wave filter, and a phase shift circuit including at least one selected from the group consisting of an inductor and a capacitor is arranged between said switch circuit and said surface acoustic wave filter, thereby obtaining high isolation between the transmitting circuit and the receiving circuit at a high transmitting frequency,
   said surface acoustic wave filter and switching elements of said high frequency switch are mounted on said laminate and connected to the electrode patterns formed therewithin through via-holes, as well as a lower surface of a lowermost layer of said laminate having terminal electrodes and a ground electrode as a plurality of external terminals to be connected to said electrode patterns through via-holes, and a part of said ground electrode is formed on the lower surface of the lowermost layer of said laminate in an isolated state from other electrodes.

2. The high-frequency switch module according to claim 1, wherein said phase shift circuit is mounted on said laminate as a chip part or formed as an electrode pattern in said laminate.

3. The high-frequency switch module according to claim 1, wherein said surface acoustic wave filter is a surface acoustic wave filter with unbalanced input and balanced output.

4. The high-frequency switch module according to claim 3, wherein said surface acoustic wave filter has different input and output impedances, thereby functioning as an impedance-converting circuit.

5. The high-frequency switch module according to claim 3, wherein an inductor is arranged in parallel to said balanced output terminal of said surface acoustic wave filter.

6. A high-frequency switch module constituted by a laminate constituted by a plurality of dielectric layers each having an electrode pattern, said high-frequency switch module comprising a high-frequency switch circuit for switching a transmitting circuit and a receiving circuit of transmitting/receiving systems, and a filter circuit connected to a receiving side of said high-frequency switch circuit, wherein said filter circuit is a surface acoustic wave filter with unbalanced input and balanced output, said surface acoustic wave filter and switching elements of said high frequency switch are mounted on said laminate and connected to the electrode patterns formed therewithin through via-holes, as well as a lower surface of a lowermost layer of said laminate having a plurality of external terminals including balanced output terminals, and the balanced output terminal of said surface acoustic wave filter is connected thereto via the adjacently arranged balanced output terminals and via-holes.

7. The high-frequency switch module according to claim 6, wherein said surface acoustic wave filter has different input and output impedances, thereby functioning as an impedance-converting circuit.

8. The high-frequency switch module according to claim 6, wherein an inductor is arranged in parallel to said balanced output terminal in the vicinity of the balanced output terminal of said surface acoustic wave filter.

9. The high-frequency switch module according to claim 6, wherein said surface acoustic wave filter is connected to an inductor arranged in parallel to the balanced output terminal of said surface acoustic wave filter via a connection line formed in said laminate.

10. The high-frequency switch module according to claim 6, wherein an inductor arranged in parallel to a balanced output terminal of said surface acoustic wave filter is a chip inductor, which is mounted on said laminate.

11. The high-frequency switch module according to claim 6, wherein an inductor arranged in parallel to a balanced output terminal of said surface acoustic wave filter is constituted by a transmission line in a coil-like, meandering or spiral shape, which is formed in said laminate.

12. A high-frequency switch module comprising a laminate constituted by a plurality of dielectric layers each having an electrode pattern, said high-frequency switch module comprising a high-frequency switch circuit for switching a transmitting circuit and a receiving circuit of transmitting/receiving systems, a surface acoustic wave filter connected to a receiving system of said high-frequency switch circuit, and a balanced-to-unbalanced transforming circuit connected to said surface acoustic wave filter; wherein said high-frequency switch circuit comprises a switching element, a first transmission line and a first capacitor as main elements, wherein at least part of said first transmission line and said first capacitor is constituted by said electrode patterns in said laminate; wherein said balanced-to-unbalanced transforming circuit is a balanced-to-unbalanced transformer; wherein said balanced-to-unbalanced transformer comprises a second transmission line as a main element; and wherein said second transmission line is formed by said electrode patterns in said laminate.

13. The high-frequency switch module according to claim 12, further comprising a phase shift circuit between said high-frequency switch circuit and said surface acoustic wave filter.

14. The high-frequency switch module according to claim 13, wherein said phase shift circuit is constituted by a transmission line or a capacitor formed by said electrode patterns.

15. The high-frequency switch module according to claim 13, wherein said phase shift circuit is constituted by a chip inductor or a chip capacitor mounted on said laminate.

16. The high-frequency switch module according to any one of claims 1 and 2-15, wherein said laminate has opposing main surfaces and side surfaces extending between both main surfaces and wherein said surface acoustic wave filter is mounted face-down on at least one main surface as a bare chip.

* * * * *